(12) United States Patent
Sekito

(10) Patent No.: US 9,332,653 B2
(45) Date of Patent: May 3, 2016

(54) RESIN COMPOSITION FOR INSULATING FILM, AND USE THEREOF

(71) Applicant: KANEKA CORPORATION, Osaka (JP)

(72) Inventor: Yoshihide Sekito, Shiga (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 14/374,444

(22) PCT Filed: Dec. 19, 2012

(86) PCT No.: PCT/JP2012/082874
§ 371 (c)(1),
(2) Date: Jul. 24, 2014

(87) PCT Pub. No.: WO2013/111478
PCT Pub. Date: Aug. 1, 2013

(65) Prior Publication Data
US 2014/0363639 A1 Dec. 11, 2014

(30) Foreign Application Priority Data

Jan. 25, 2012 (JP) ................................. 2012-013338
Apr. 10, 2012 (JP) ................................. 2012-089521

(51) Int. Cl.
*B32B 3/02* (2006.01)
*H05K 3/28* (2006.01)
(Continued)

(52) U.S. Cl.
CPC .............. *H05K 3/285* (2013.01); *C08G 18/003* (2013.01); *C08G 18/0823* (2013.01); *C08G 18/44* (2013.01); *C08G 18/6659* (2013.01); *C08G 18/758* (2013.01); *C08G 18/792* (2013.01); *C08G 18/8125* (2013.01); *C08J 5/18* (2013.01);
(Continued)

(58) Field of Classification Search
CPC ..................... Y10T 428/24851; C08G 18/003; C08G 18/0823; C08G 18/44; C08G 18/6659; C08G 18/758; C08G 18/792; C08G 18/8125
See application file for complete search history.

(56) References Cited

U.S. PATENT DOCUMENTS

2003/0122371 A1  7/2003  Rochford et al.
2004/0197524 A1  10/2004  Rochford et al.
(Continued)

FOREIGN PATENT DOCUMENTS

CN  101278236  10/2008
JP  9-137109  5/1997
(Continued)

OTHER PUBLICATIONS

International Search Report, PCT/JP2012/082874, Apr. 2, 2013.
(Continued)

*Primary Examiner* — Elizabeth Mulvaney
(74) *Attorney, Agent, or Firm* — Kagan Binder, PLLC

(57) ABSTRACT

The present invention provides a resin composition for an insulating film which resin composition is excellent in tack property after drying and allows a resultant insulating film to be excellent in flexibility and electrical insulation reliability and to be small in warpage after curing, a resin film for an insulating film, an insulating film, and a printed wiring board provided with an insulating film. The resin composition for an insulating film contains at least: a (A) binder polymer; and (B) cross-linked polymer particles, whose polymer has a urethane bond and a carbonate skeleton in its molecule.

16 Claims, 1 Drawing Sheet

(51) Int. Cl.
*C08J 5/18* (2006.01)
*C08K 5/5313* (2006.01)
*C08G 18/75* (2006.01)
*C08G 18/79* (2006.01)
*C08G 18/44* (2006.01)
*C08G 18/00* (2006.01)
*C08L 75/04* (2006.01)
*C08G 18/66* (2006.01)
*C08G 18/81* (2006.01)
*C08G 18/08* (2006.01)
*C09D 175/06* (2006.01)
*H05K 1/03* (2006.01)
*H05K 3/34* (2006.01)

(52) U.S. Cl.
CPC ............... *C08K 5/5313* (2013.01); *C08L 75/04* (2013.01); *C09D 175/06* (2013.01); *C08J 2375/04* (2013.01); *C08L 2205/025* (2013.01); *C08L 2205/03* (2013.01); *H05K 1/0393* (2013.01); *H05K 3/3452* (2013.01); *Y10T 428/24851* (2015.01)

(56) References Cited

U.S. PATENT DOCUMENTS

| | | |
|---|---|---|
| 2004/0232813 A1 | 11/2004 | Nakano et al. |
| 2005/0158088 A1 | 7/2005 | Someya et al. |
| 2006/0088349 A1 | 4/2006 | Someya et al. |
| 2008/0300350 A1 | 12/2008 | Ohno et al. |
| 2009/0065244 A1 | 3/2009 | Kimura et al. |
| 2009/0312519 A1 | 12/2009 | Uera et al. |
| 2010/0041785 A1 | 2/2010 | Ohashi et al. |
| 2010/0196822 A1 | 8/2010 | Sasaki et al. |
| 2011/0083884 A1 | 4/2011 | Okada et al. |
| 2013/0264099 A1 | 10/2013 | Sekido et al. |

FOREIGN PATENT DOCUMENTS

| | | |
|---|---|---|
| JP | 2000-241969 | 9/2000 |
| JP | 2002-296776 | 10/2002 |
| JP | 2002-322221 | 11/2002 |
| JP | 2006-40935 | 2/2006 |
| JP | 2008-181750 | 8/2008 |
| JP | 2009-230076 | 10/2009 |
| JP | 2009-271445 | 11/2009 |
| JP | 2010-117452 | 5/2010 |
| JP | 2010-139559 | 6/2010 |
| JP | 2010-143988 | 7/2010 |
| JP | 2010-169810 | 8/2010 |
| JP | 2011-190424 | 9/2011 |
| KR | 2010/0069559 | 6/2010 |
| KR | 2011/0033181 | 3/2011 |
| TW | 200811229 | 3/2008 |
| TW | 201105720 | 2/2011 |
| WO | 2007/125806 | 11/2007 |
| WO | 2011/062053 | 5/2011 |

OTHER PUBLICATIONS

International Preliminary Report on Patentability, PCT/JP2012/082874, Aug. 7, 2014.

English Translation of International Search Report, International Application No. PCT/JP2012/060978, mailed May 29, 2012.

English Translation of International Preliminary Report on Patentability, International Application No. PCT/JP2012/060978, mailed Nov. 7, 2013.

English Translation of International Search Report and Written Opinon, International Application No. PCT/JP2011/072612, mailed Nov. 1, 2011.

English Translation of International Preliminary Report on Patentability, International Application No. PCT/JP2011/072612, mailed Jun. 27, 2013.

Notice of Allowance, U.S. Appl. No. 14/113,541, mailed Dec. 22, 2014.

Prosecution History from U.S. Appl. No. 13/993,613 through Nov. 5, 2015.

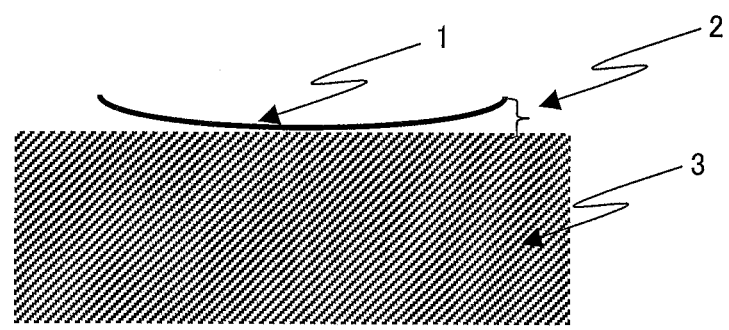

RESIN COMPOSITION FOR INSULATING FILM, AND USE THEREOF

This application claims benefit from International Application No. PCT/JP2012/082874, which was filed on Dec. 19, 2012, which in turn claims priority to Japanese Application No. 2012-013338, which was filed on Jan. 25, 2012, and Japanese Application No. 2012-089521, which was filed on Apr. 10, 2012, wherein the entireties of said patent applications are incorporated herein by reference.

TECHNICAL FIELD

The present invention relates to a novel resin composition for an insulating film and use thereof. More specifically, the present invention relates to a novel resin composition for an insulating film which resin composition is excellent in tack property after drying and allows a resultant insulating film to be excellent in flexibility and electrical insulation reliability and to be small in warpage after curing, a resin film for an insulating film which resin film is obtained from the novel resin composition for an insulating film, an insulating film, and a printed wiring board provided with an insulating film.

BACKGROUND ART

Polyimide resin is widely used for electric and electronic purposes due to its excellence in heat resistance, electrical insulation reliability, chemical resistance, and mechanical properties. For example, polyimide resin is used as a substrate material and/or a surface protecting material for a flexible circuit board, an integrated circuit board, or the like. Alternatively, polyimide resin is used to provide an insulating film and/or a protective coating film on a semiconductor device and also to provide a microcircuit with an interlayer insulating film and/or a protective film.

In particular, in a case where polyimide resin is used as a surface protecting material for a flexible circuit board, a cover lay film obtainable by applying an adhesive to a molded article such as a polyimide film is used. The cover lay film is generally adhered to the flexible circuit board by the following method. That is, an opening is secured in advance, by punching or the like method, at a bonding portion between the cover lay film and a terminal portion or a component of a circuit, the opening and the cover lay film are aligned with each other, and the cover lay film and the flexible circuit board are then subjected to thermocompression bonding by a thermal press or the like.

It is, however, difficult to secure an opening in a thin cover lay film with high accuracy, and the alignment to bond the cover lay film and the flexible circuit board to each other is usually carried out manually. This causes insufficiently accurate alignment and low workability at the lamination, thus leading to increases in cost.

Meanwhile, a surface protecting material for a circuit board can be provided by using a method in which a resin composition, called a solder resist, having an insulation function is directly applied on a circuit board, and the resin composition is then cured to provide an insulating film. The solder resist has excellent flexibility and electrical insulation reliability as an insulating material. However, the solder resist has excess viscosity (poor tack property) caused after a coating film formed by applying the solder resist to a circuit board is dried, decreases in workability and yield, a contact fault, and/or process pollution.

There have been proposed various solder resists that have improved tack property while maintaining flexibility and electrical insulation reliability.

Further, there has been proposed, as a solder resist, a thermosetting resin composition that offers a good balance of properties such as printability, tack property, matting property, electrical insulation property, and adhesiveness to a coated product (see, for example, Patent Literature 1).

CITATION LIST

Patent Literatures

Patent Literature 1

International Application Publication, No. WO 2007/125806

SUMMARY OF INVENTION

Technical Problem

Patent Literature 1 listed above proposes various methods for solving the aforementioned problems concerning solder resists. The thermosetting resin composition described in Patent Literature 1 solves excess viscosity caused after the coating film is dried and further cured by heat, but still has the problem that excess viscosity is caused after the coating film is dried.

Solution to Problem

The inventor of the present invention studied diligently to solve the above problems, and finally found that a resin composition for an insulating film which resin composition contains at least a (A) binder polymer and (B) cross-linked polymer particles, whose polymer has a urethane bond and a carbonate skeleton in its molecule, has excellent tack property after drying. Further, the inventor confirmed that an insulating film produced from the resin composition for an insulating film is excellent in flexibility and electrical insulation reliability and small in warpage after curing. Consequently, the inventor gained knowledge that it is possible to obtain a resin composition for an insulating film, a resin film for an insulating film, an insulating film, and a printed wiring board provided with an insulating film, all of which are excellent in the properties described above. Then, the inventor attained the present invention in accordance with such knowledge. The present invention allows the following resin composition for an insulating film, which resin composition has a novel feature, to solve the above problems.

That is, a resin composition for an insulating film, in accordance with the present invention, is a resin composition for an insulating film, the resin composition including at least: a (A) binder polymer; and (B) cross-linked polymer particles, whose polymer has a urethane bond and a carbonate skeleton in its molecule. The resin composition for an insulating film, in accordance with the present invention, is preferably further includes: a (C) thermosetting resin. The resin composition for an insulating film, in accordance with the present invention, is preferably further includes: a (D) compound having a radically polymerizable group in its molecule; and a (E) photopolymerization initiator. It is preferable that the (A) binder polymer has at least one selected from the group consisting of a (a1) urethane bond, a (a2) carboxyl group, and an (a3) imide group. It is preferable that the (B) cross-linked polymer particles, whose polymer has a urethane bond and a carbonate skeleton in its molecule, are not less than 1 μm and not more than 20 μm in average particle diameter. It is preferable that an amount of oil absorption of the (B) cross-linked polymer particles, whose polymer has a urethane bond and a carbonate skeleton in its molecule, is not less than 50 ml/100 g. The resin composition for an insulating film, in accordance with the present invention, is preferably such that the (B) cross-linked polymer particles, whose polymer has a urethane bond and a carbonate skeleton in its molecule, is mixed in an amount of not less than 30 parts by weight and not more than 100 parts by weight, with respect to 100 parts by weight of the (A) binder polymer. The resin composition for an insulating film, in accordance with the present invention, preferably further includes: a (F) phosphoric flame retardant. It is preferable that the (F) phosphoric flame retardant is phosphinate. The resin composition for an insulating film, in accordance with the present invention, is preferably such that the (F) phosphoric flame retardant is mixed in an amount of not less than 5 parts by weight and not more than 100 parts by weight, with respect to 100 parts by weight of the (A) binder polymer.

A resin film for an insulating film, in accordance with the present invention, is obtained by applying, to a surface of a base material, the resin composition for an insulating film and then drying the resin composition.

An insulating film, in accordance with the present invention, is obtained by curing the resin film for an insulating film.

A printed wiring board provided with an insulating film, in accordance with the present invention, is obtained by covering a printed wiring board with the above insulating film.

A resin film for an insulating film, in accordance with the present invention, is obtained from the above resin composition for an insulating film.

An insulating film, in accordance with the present invention, is obtained from the above resin composition for an insulating film.

A printed wiring board provided with an insulating film, in accordance with the present invention, is obtained by covering a printed wiring board with the above insulating film.

Advantageous Effects of Invention

As described above, a resin composition for an insulating film, in accordance with the present invention, is configured to contain at least a (A) binder polymer and (B) cross-linked polymer particles, whose polymer has a urethane bond and a carbonate skeleton in its molecule. Thus, the resin composition for an insulating film, in accordance with the present invention, has excellent tack property after drying. Further, an insulating film produced from the resin composition for an insulating film, in accordance with the present invention, is excellent in flexibility and electrical insulation reliability and small in warpage after curing. Consequently, the resin composition for an insulating film, in accordance with the present invention, yields an excellent effect of being suitably usable as a surface protecting material or the like for various circuit boards. Further, it is possible to provide a resin film for an insulating film, an insulating film, and a printed wiring board provided with an insulating film, all of which are obtained from the above resin composition for an insulating film.

BRIEF DESCRIPTION OF DRAWINGS

FIG. 1

FIG. 1 is a schematic diagram for explaining how to measure the degree of warpage of a film.

DESCRIPTION OF EMBODIMENTS

The description below deals in detail with first (I) a resin composition for an insulating film and then (II) a method of using a resin composition for an insulating film, in accordance with the present invention.

(I) Resin Composition for Insulating Film

A resin composition for an insulating film in accordance with the present invention is a resin composition containing at least (A) a binder polymer and (B) cross-linked polymer particles, whose polymer has a urethane bond and a carbonate skeleton in its molecule, and is a resin composition used to form an insulating film.

The inventor of the present invention has found that the aforementioned resin composition for an insulating film has various excellent properties, and presumes that it is for the following reasons. The component (B) of the present invention is cross-linked polymer particles, whose polymer has a urethane bond and a carbonate skeleton in its molecule. Such cross-linked polymer particles serve to provide irregularities formed at a surface of a resultant insulating film, thus allowing an insulating film obtained after drying a base material having the resin composition applied thereto to have excellent tack property. Further, the component (B) is soft because it has a urethane bond. This causes no decrease in flexibility of an insulating film obtained by curing the resin composition for an insulating film. Still further, the component (B) has a crosslinked structure. This allows a resultant insulating film to have excellent heat resistance and chemical resistance. Containing a filler component at a high proportion will generally decrease flexibility of resisting repeated foldings of a resultant insulating film. However, a combination of the components (A) and (B) surprisingly provides an insulating film having very excellent flexibility and excellent folding endurance. The inventor presumes that such an effect is achieved for the following reason; the component (A), which forms a matrix of the insulating film, seeps into the component (B), and high adhesiveness is thus achieved at an interface between the component (A) and the component (B). The inventor further presumes that the above effect is achieved for the following reason; the component (B) has a carbonate skeleton and thus provides an insulating film having excellent hydrolysis resistance and having excellent electrical insulation reliability at high temperature and high humidity, without sacrificing the flexibility and folding endurance as described above.

The following description deals with (A) a binder polymer, (B) cross-linked polymer particles, whose polymer has a urethane bond and a carbonate skeleton in its molecule, (C) a thermosetting resin, (D) a compound having a radically polymerizable group in its molecule, (E) a photo-polymerization initiator, (F) a phosphoric flame retardant, and other components. The following description also deals with a method of mixing the resin composition for an insulating film.

<(A) Binder Polymer>

The (A) binder polymer of the present invention is a polymer that is soluble in an organic solvent and that has a weight-average molecular weight of not lower than 1,000 and not higher than 1,000,000 based on polyethylene glycol.

The above organic solvent is not particularly limited to any specific one. Examples of the organic solvent encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; and γ-butyrolactone. Further, these organic solvents can be used optionally in combination with an aromatic hydrocarbon such as xylene or toluene, as needed.

Further examples of the organic solvent encompass: solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether.

Whether a binder polymer is soluble in organic solvent is determined on the basis of an index called organic solvent solubility, which can be measured from parts by weight of the binder polymer that are dissolvable in 100 parts by weight of an organic solvent. If not smaller than 5 parts by weight of a binder polymer are dissolved in 100 parts by weight of an organic solvent, that binder polymer can be determined as soluble in organic solvent. How the organic solvent solubility is measured is not particularly limited to any specific one. The organic solvent solubility can be measured by, for example, a method of (i) adding 5 parts by weight of a binder polymer to 100 parts by weight of an organic solvent, (ii) stirring the mixture at 40° C. for 1 hour, (iii) cooling the resultant mixture down to a room temperature (23° C.), and (iv) leaving the cooled mixture to stand for more than 24 hours. In a case where the resulting solution is confirmed to be a uniform solution with no undissolved matter or precipitate produced, the binder polymer is determined as soluble in organic solvent.

The weight-average molecular weight of the component (A) of the present invention can be measured under, for example, the following measurement condition.

(Condition for Measurement of Weight-Average Molecular Weight)

Apparatus used: equivalent of HLC-8220GPC manufactured by TOSOH Corporation

Column: TSK gel Super AWM-H manufactured by TOSOH Corporation (6.0 mm I.D.×15 cm) (2 columns)

Guard column: TSK guard column Super AW-H manufactured by TOSOH Corporation

Carrier: 30 mM LiBr+20 mM $H_3PO_4$ in DMF

Flow speed: 0.6 mL/min

Column temperature: 40° C.

Detection conditions: RI: polarity (+), response (0.5 sec)

Sample concentration: approximately 5 mg/mL

Reference standard: PEG (polyethylene glycol)

Controlling the weight-average molecular weight of the component (A) within the range from not lower than 1,000 and not higher than 1,000,000 based on polyethylene glycol is preferable because the weight-average molecular weight controlled as such allows an insulating film produced to be excellent in flexibility and chemical resistance. A weight-average molecular weight of lower than 1,000 may decrease the flexibility and/or chemical resistance of the insulating film, whereas a weight-average molecular weight of higher than 1,000,000 may increase viscosity of a resin composition for an insulating film.

The component (A) of the present invention is not particularly limited to any specific one. Examples of the component (A) encompass: polyurethane resins, poly(meth)acrylic resins, polyvinyl resins, polystyrene resins, polyethylene resins, polypropylene resins, polyimide resins, polyamide resins, polyacetal resins, polycarbonate resins, polyester resins, polyphenylene ether resins, polyphenylene sulfide resins, polyether sulfone resins, and polyether ketone resins. These resins can be used solely, or two or more types thereof can be used in combination. The component (A) of the present invention is preferably, among the above resins, a polyurethane resin which is a resin having a (a1) urethane bond in its molecule or a poly(meth)acrylic resin. This preference is because such an arrangement allows an insulating film produced from the resultant resin composition for an insulating film to be improved in flexibility and folding endurance and to thus have less warpage. Further, the component (A) of the present invention is preferably a resin containing a (a2) carboxyl group. This preference is because such an arrangement allows an insulating film produced from the resultant resin composition for an insulating film to be improved in adhesiveness with respect to a base material. Still further, the component (A) of the present invention is preferably a polyimide resin that is a resin containing a (a3) imide group. This preference is because such an arrangement allows an insulating film produced from the resultant resin composition for an insulating film to be improved in heat resistance, flame retardancy, and electrical insulation reliability. The component (A) of the present invention is preferably two or three of the following resins: the resin having a (a1) urethane bond; the resin containing a (a2) carboxyl group; and the resin containing a (a3) imide group. This preference is because such an arrangement causes respective properties of these resins to be worked synergistically and thus allows an insulating film produced from the resultant resin composition for an insulating film to be excellent in various properties.

<Resin Having (a1) Urethane Bond>

The resin having the (a1) urethane bond in accordance with the present invention is a polymer that (i) is soluble in an organic solvent, (ii) has a repeating unit having at least one urethane bond in its molecule, and (iii) has a weight-average molecular weight of not lower than 1,000 and not higher than 1,000,000 based on polyethylene glycol.

The component (A) in accordance with the present invention is preferably a resin having the (a1) urethane bond in its molecule, for the following reason; the component (A) has very good affinity with the component (B) in accordance with the present invention, i.e. the (B) cross-linked polymer particles, whose polymer has a urethane bond and a carbonate skeleton in its molecule, since the component (B) has a urethane bond in its molecule, like the resin having the (a1) urethane bond. This causes the resin having the (a1) urethane bond to seep into the component (B) in accordance with the present invention from cross-linked polymer particle surfaces of the component (B), and thus achieves high adhesiveness with a matrix. This allows an insulating film produced from a resin composition for an insulating film to have improved flexibility and folding endurance and to be small in warpage.

The resin having the (a1) urethane bond in accordance with the present invention can be produced through any reaction.

The resin can be produced by, for example, reacting (i) a diol compound represented by General Formula (1):

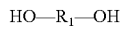
HO—$R_1$—OH        General Formula (1)

where $R_1$ represents a divalent organic group, with (ii) a diisocyanate compound represented by General Formula (2):

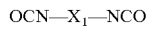
OCN—$X_1$—NCO        General Formula (2)

where $X_1$ represents a divalent organic group, into a structure containing a repeating unit that has a urethane bond represented by General Formula (3):

General Formula (3)

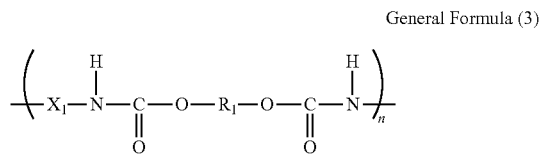

where $R_1$ and $X_1$ each independently represent a divalent organic group, and n represents an integer of 1 or more.

The diol compound of the present invention is not particularly limited to any specific one as long as it has the structure represented by General Formula (1) above. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,7-heptanediol, 1,8-octanediol, 2-methyl-1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol with polybasic acid; a polycarbonate diol having a carbonate skeleton; a polycaprolactone diol obtained by performing ring opening addition of lactones such as γ-butyl lactone, ε-caprolactone, and δ-valerolactone; bisphenol A and an ethylene oxide adduct of bisphenol A; a propylene oxide adduct of bisphenol A; hydrogenated bisphenol A and an ethylene oxide adduct of hydrogenated bisphenol A; and a propylene oxide adduct of hydrogenated bisphenol A. These compounds can be used solely, or two or more types thereof can be used in combination.

In particular, the diol compound of the present invention is preferably a long chain diol, such as polyethylene glycol, polypropylene glycol, polytetramethylene glycol, polyoxyalkylene diol, polyester diol, polycarbonate diol, or polycaprolactone diol. This preference is because such an arrangement allows an insulating film produced from the resultant resin composition for an insulating film to be decreased in elasticity and improved in flexibility and folding endurance, and as a result, the insulating film is small in warpage.

The diisocyanate compound of the present invention is not particularly limited to any specific one as long as it has the structure represented by General Formula (2) above. Examples of the diisocyanate compound encompass: aromatic diisocyanate compounds such as diphenylmethane-2,4'-diisocyanate, 3,2'-dimethyl diphenylmethane-2,4'-diisocyanate, 3,3'-dimethyl diphenylmethane-2,4'-diisocyanate, 4,2'-dimethyl diphenylmethane-2,4'-diisocyanate, 4,3'-dimethyl diphenylmethane-2,4'-diisocyanate, 5,2'-dimethyl diphenylmethane-2,4'-diisocyanate, 5,3'-dimethyl diphenylmethane-2,4'-diisocyanate, 6,2'-dimethyl diphenylmethane-2,4'-diisocyanate, 6,3'-dimethyl diphenylmethane-2,4'-diisocyanate, 3,2'-diethyl diphenylmethane-2,4'-diisocyanate, 3,3'-diethyl diphenylmethane-2,4'-diisocyanate, 4,2'-diethyl diphenylmethane-2,4'-diisocyanate, 4,3'-diethyl diphenylmethane-2,4'-diisocyanate, 5,2'-diethyl diphenylmethane-2,4'-diisocyanate, 5,3'-diethyl diphenylmethane-2,4'-diisocyanate, 6,2'-diethyl diphenylmethane-2,4'-diisocyanate, 6,3'-diethyl diphenylmethane-2,4'-diisocyanate, 3,2'-dimethoxy diphenylmethane-2,4'-diisocyanate, 3,3'-dimethoxy diphenylmethane-2,4'-diisocyanate, 4,2'-dimethoxy diphenylmethane-2,4'-diisocyanate, 4,3'-dimethoxy diphenylmethane-2,4'-diisocyanate, 5,2'-dimethoxy diphenylmethane-2,4'-diisocyanate, 5,3'-dimethoxy diphenylmethane-2,4'-diisocyanate, 6,2'-dimethoxy diphenylmethane-2,4'-diisocyanate, 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. These compounds can be used solely, or two or more types of them can be used in combination.

In particular, alicyclic diisocyanate and an aliphatic diisocyanate compound are preferably used as the diisocyanate compound of the present invention. This is because such an arrangement allows an insulating film produced from the resultant resin composition for an insulating film to have excellent flexibility.

The resin having a urethane bond in its molecule in accordance with the present invention is synthesized by a method of (i) mixing the diol compound with the diisocyanate compound in such respective amounts that isocyanate groups and hydroxyl groups are contained at a number ratio of isocyanate groups/hydroxyl groups of not smaller than 0.5 and not larger than 2.0, and (ii) reacting the mixture without any solvent or in an organic solvent.

In the case where two or more types of the diol compound are used to synthesize the resin having a urethane bond in its molecule in accordance with the present invention, the reaction thereof with the diisocyanate compound may be performed after the two or more types of the diol compound are mixed with each other, or each of the two or more types of the diol compound may be reacted with the diisocyanate compound independently. In an alternative method, the reaction may be performed such that (i) a diol compound is initially reacted with the diisocyanate compound, (ii) an isocyanate group at a terminal of the resultant resin is reacted with another diol compound, and (iii) a product obtained after the reaction is further reacted with the diisocyanate compound. Further, in the case where two or more types of the diisocyanate compound are used, the reaction can be performed in the same manner as above. By using any of the above-described methods, an intended resin having a urethane bond in its molecule can be prepared.

The reaction between the diol compound and the diisocyanate compound is performed at a temperature of preferably (i) not lower than 40° C. and not higher than 160° C., and more preferably (ii) not lower than 60° C. and not higher than 150° C. If the temperature is less than 40° C., the reaction takes too much time. If the temperature exceeds 160° C., a three-dimensional reaction occurs during the reaction, which easily causes gelatinization. How long the reaction between the diol compound and the diisocyanate compound is performed can be determined as appropriate depending on a batch scale or a reaction condition to be adopted. Further, the reaction may optionally be performed in the presence of a catalyst such as (i) a tertiary amine or (ii) a metal compound or semi-metal compound (for example, alkaline metal, alkaline earth metal, tin, zinc, titanium, or cobalt).

The above reaction between the diol compound and the diisocyanate compound can be performed without any solvent. However, the reaction is desirably performed with an organic solvent system for the sake of better control of the reaction. The organic solvent employed here is not particularly limited to any specific one. Examples of the organic solvent encompass those listed above.

It is desirable that the organic solvent used in the reaction between the diol compound and the diisocyanate compound be added in such an amount that a solute weight concentration in a reaction solution, that is, a concentration of the reaction solution, is not lower than 5% by weight and not higher than 90% by weight. The solute weight concentration in the reaction solution is more preferably not lower than 10% by weight and not higher than 80% by weight. The concentration of lower than 5% by weight is not preferable because such a concentration will make it difficult to produce a polymerization reaction and thus decrease a reaction speed, and as a result, an intended structural substance may not be prepared. The concentration of higher than 90% by weight is not preferable because it will cause the reaction solution to be highly viscous, which may render the reaction ununiform.

The resin having the (a1) urethane bond in accordance with the present invention may further contain a carboxyl group and/or an imide group. The resin having the (a1) urethane bond preferably contains a carboxyl group. This is because such an arrangement allows an insulating film produced from the resultant resin composition for an insulating film to be improved in adhesiveness with respect to a base material. On the other hand, in a case where the resin having the (a1) urethane bond contains an imide group, such an arrangement allows an insulating film produced from the resultant resin composition for an insulating film to be improved in (i) heat resistance and (ii) electrical insulation reliability at high temperature and high humidity. As such, in a case where such an insulating film produced from the resin composition for an insulating film is used as a covering material for a printed wiring board, it is possible to prepare a highly-reliable printed wiring board.

The resin containing a carboxyl group and having the (a1) urethane bond can be produced through any reaction. Such a resin can be produced by, for example, reacting, in addition to the diol compound and the diisocyanate compound, a compound containing two hydroxyl groups and one carboxyl group, the compound being represented by General Formula (4):

General Formula (4)

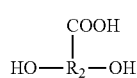

where $R_2$ represents a trivalent organic group.

The compound containing two hydroxyl groups and one carboxyl group in accordance with the present invention is not particularly limited to any specific one as long as it has the structure represented by General Formula (4) above. Examples of the compound encompass: 2,2-bis(hydroxymethyl)propionic acid; 2,2-bis(2-hydroxyethyl)propionic acid; 2,2-bis(3-hydroxypropyl)propionic acid; 2,3-dihydroxy-2-methylpropionic acid; 2,2-bis(hydroxymethyl)butanoic acid; 2,2-bis(2-hydroxyethyl)butanoic acid; 2,2-bis(3-hydroxypropyl)butanoic acid; 2,3-dihydroxybutanoic acid; 2,4-dihydroxy-3,3-dimethylbutanoic acid; 2,3-dihydroxyhexadecanoic acid; 2,3-dihydroxybenzoic acid; 2,4-dihydroxybenzoic acid; 2,5-dihydroxybenzoic acid; 2,6-dihydroxybenzoic acid; 3,4-dihydroxybenzoic acid; and 3,5-dihydroxybenzoic acid. These compounds can be used solely, or two or more types thereof can be used in combination.

The resin containing the imide group and having the (a1) urethane bond can be produced through any reaction. Such a resin can be produced by, for example, reacting, in addition to the diol compound and the diisocyanate compound, a tetracarboxylic acid dianhydride represented by General Formula (5):

General Formula (5)

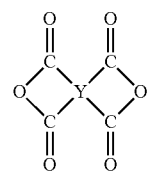

where Y represents a tetravalent organic group.

The tetracarboxylic acid dianhydride in accordance with the present invention is not particularly limited to any specific one as long as it has the structure represented by General Formula (5) above. Examples of the tetracarboxylic acid dianhydride encompass: 3,3',4,4'-benzophenone tetracarboxylic acid dianhydride; pyromellitic acid dianhydride; 3,3',4,4'-oxydiphthalic acid dianhydride; 2,2-bis[4-(3,4-dicarboxyphenoxy)phenyl]propane dianhydride; 2,2-bis(4-hydroxyphenyl)propane dibenzoate-3,3',4,4'-tetracarboxylic acid dianhydride; 3,3',4,4'-diphenyl sulfone tetracarboxylic acid dianhydride; 3,3',4,4'-biphenyltetracarboxylic acid dianhydride; 2,3,3',4-biphenyltetracarboxylic acid dianhydride; and 5-(2,5-dioxotetrahydro-3-furanyl)-3-methyl-3-cyclohexene-1,2-dicarboxylic acid anhydride. These tetracarboxylic acid dianhydrides can be used solely, or two or more types thereof can be used in combination.

<Resin Containing (a2) Carboxyl Group>

The resin containing the (a2) carboxyl group in accordance with the present invention is a polymer that (i) is soluble in an organic solvent, (ii) has a repeating unit having at least one carboxyl group in its molecule, and (iii) has a weight-average molecular weight of not lower than 1,000 and not higher than 1,000,000 based on polyethylene glycol.

The resin containing the (a2) carboxyl group in accordance with the present invention can be produced through any reaction. For example, the aforementioned method of producing the resin having the (a1) urethane bond is used so as to react, in addition to the diol compound and the diisocyanate compound, the compound, which is represented by General Formula (4) above, containing two hydroxyl groups and one carboxyl group. In this manner, the resin containing the (a2) carboxyl group in accordance with the present invention is produced.

Alternatively, the resin containing the (a2) carboxyl group in accordance with the present invention can be synthesized by a method of reacting a (meth)acrylic acid and a (meth) acrylic acid ester derivative.

The reaction between a (meth)acrylic acid and a (meth) acrylic acid ester can be carried out by any method. Such a reaction can be carried out by, for example, reacting a (meth) acrylic acid and/or a (meth)acrylic acid ester derivative in a solvent in the presence of a radical polymerization initiator.

The above (meth)acrylic acid ester derivative in accordance with the present invention is not particularly limited to any specific one. Examples of the (meth)acrylic acid ester derivative encompass: methyl (meth)acrylate; ethyl (meth) acrylate; butyl (meth)acrylate; isobutyl (meth)acrylate; t-butyl (meth)acrylate; hexyl (meth)acrylate; 2-ethylhexyl (meth) acrylate; octyl (meth)acrylate; nonyl (meth)acrylate; decyl (meth)acrylate; dodecyl (meth)acrylate; stearyl (meth)acrylate; and benzyl (meth)acrylate. These (meth)acrylic acid ester derivatives can be used solely, or two or more types thereof can be used in combination. The present invention preferably uses, among the above (meth)acrylic acid ester derivatives, methyl (meth)acrylate, ethyl (meth)acrylate, or butyl (meth)acrylate in particular for better flexibility and chemical resistance of an insulating film produced from a resin composition for an insulating film.

Examples of the above radical polymerization initiator encompass: azo-based compounds such as azobisisobutyronitrile, azobis(2-methylbutylonitrile), and 2,2'-azobis-2,4-dimethyl valeronitrile; organic peroxides such as t-butylhydroperoxide, cumene hydroperoxide, benzoyl peroxide, dicumyl peroxide, and di-t-butyl peroxide; persulfates such as potassium persulfate, sodium persulfate, and ammonium persulfate; and hydrogen peroxide. These radical polymerization initiators can be used solely, or two or more types thereof can be used in combination.

The radical polymerization initiator is used in an amount preferably of, with respect to 100 parts by weight of a monomer used, not smaller than 0.001 parts by weight and not larger than 5 parts by weight, and more preferably of not smaller than 0.01 parts by weight and not larger than 1 part by weight. If the amount is smaller than 0.001 parts by weight, the reaction does not proceed readily. If the amount is larger than 5 parts by weight, the molecular weight may be decreased.

The solvent used in the reaction between (meth)acrylic acid and (meth)acrylic acid ester is added in such an amount that a solute weight concentration in a reaction solution, that is, a concentration of the reaction solution, is preferably (i) not lower than 5% by weight and not higher than 90% by weight, and more preferably (ii) not lower than 20% by weight and not higher than 70% by weight. If the concentration of the reaction solution is lower than 5% by weight, it will be difficult to produce a polymerization reaction, and a reaction speed will decrease. As a result, an intended structural substance may not be prepared. If the concentration of the reaction solution is higher than 90% by weight, the reaction solution will be highly viscous, which may render the reaction ununiform.

The reaction between (meth)acrylic acid and (meth)acrylic acid ester is performed at a temperature of preferably (i) not lower than 20° C. and not higher than 120° C., and more preferably (ii) not lower than 50° C. and not higher than 100° C. If the reaction temperature is lower than 20° C., the reaction takes too much time. If the temperature exceeds 120° C., a rapid procession of the reaction and a side reaction may cause three-dimensional crosslinking, which may in turn cause gelatinization. How long the reaction between (meth) acrylic acid and (meth)acrylic acid ester is performed can be determined as appropriate depending on a batch scale or a reaction condition to be adopted.

Further alternatively, the resin containing the (a2) carboxyl group in accordance with the present invention can be synthesized by a method of reacting (i) a resin containing a functional group, such as a hydroxyl group, an isocyanate group, an amino group, or an epoxy group, and (ii) a polyvalent carboxylic acid compound.

<Resin Containing (a3) Imide Group>

The resin containing the (a3) imide group in accordance with the present invention is a polymer that (i) is soluble in an organic solvent, (ii) has a repeating unit having at least one imide group in its molecule, and (iii) has a weight-average molecular weight of not lower than 1,000 and not higher than 1,000,000 based on polyethylene glycol.

The resin containing the (a3) imide group in accordance with the present invention can be produced through any reaction. Such a resin can be produced by, for example, reacting the tetracarboxylic acid dianhydride represented by General Formula (5) above with a diamino compound represented by General Formula (6):

$$H_2N\text{-}z\text{-}NH_2 \quad \text{General formula (6)}$$

where Z represents a divalent organic group.

Tetracarboxylic acid dianhydride in accordance with the present invention is not particularly limited as long as it has the structure represented by General Formula (5) above. Examples of tetracarboxylic acid dianhydride encompass 3,3',4,4'-benzophenone tetracarboxylic acid dianhydride, pyromellitic acid dianhydride, 3,3',4,4'-oxydiphthalic acid dianhydride, 2,2-bis[4-(3,4-dicarboxyphenoxy)phenyl]propane dianhydride, 2,2-bis(4-hydroxyphenyl)propane dibenzoate-3,3',4,4'-tetracarboxylic acid dianhydride, 3,3',4,4'-diphenyl sulfone tetracarboxylic acid dianhydride, 3,3',4,4'-biphenyltetracarboxylic acid dianhydride, 2,3,3',4-biphenyltetracarboxylic acid dianhydride, and 5-(2,5-dioxotetrahydro-3-furanyl)-3-methyl-3-cyclohexene-1,2-dicarboxylic acid anhydride. These tetracarboxylic acid dianhydrides can be used solely, or two or more types thereof can be used in combination.

The diamino compound of the present invention is not particularly limited to any specific one as long as it has the structure represented by General Formula (6) above. Examples of the diamino compound encompass: diamino phenols such as m-phenylenediamine, o-phenylenediamine, p-phenylenediamine, m-aminobenzylamine, p-aminobenzylamine, bis(3-aminophenyl)sulfide, (3-aminophenyl) (4-aminophenyl) sulfide, bis(4-aminophenyl)sulfide, bis(3-aminophenyl)sulfoxide, (3-aminophenyl)(4-aminophenyl) sulfoxide, bis(4-aminophenyl)sulfoxide, bis(3-aminophenyl) sulfone, (3-aminophenyl)(4-aminophenyl)sulfone, bis(4-aminophenyl)sulfone, 3,4'-diaminobenzophenone, 4,4'-diaminobenzophenone, 3,3'-diaminobenzophenone, 3,3'-diaminodiphenylmethane, 3,4'-diaminodiphenylmethane, 4,4'-diaminodiphenylmethane, 4,4'-diaminodiphenylether, 3,3'-diaminodiphenylether, 3,4'-diaminodiphenylether, bis [4-(3-aminophenoxy)phenyl]sulfoxide, bis[4-(aminophenoxy)phenyl]sulfoxide, [(4-aminophenoxyphenyl)(3-aminophenoxyphenyl)phenyl]sulfoxide, bis[4-(3-aminophenoxy)phenyl]sulfone, bis[4-(4-aminophenoxy) phenyl]sulfone, [(4-aminophenoxyphenyl)(3-aminophenoxyphenyl)phenyl]sulfone, bis[4-(3-aminophenoxy)phenyl]sulfide, bis[4-(aminophenoxy) phenyl]sulfide, [(4-aminophenoxyphenyl)(3-aminophenoxyphenyl)phenyl]sulfide, 3,3'-diaminobenzanilide, 3,4'-diaminobenzanilide, 4,4'-diaminobenzanilide, bis[4-(3-aminophenoxy)phenyl] methane, bis[4-(4-aminophenoxy)phenyl]methane, [4-(4-aminophenoxyphenyl)][4-(3-aminophenoxyphenyl)]

methane, 1,1-bis[4-(3-aminophenoxy)phenyl]ethane, 1,1-bis[4-(4-aminophenoxy)phenyl]ethane, 1,1-[4-(4-aminophenoxyphenyl)][4-(3-aminophenoxyphenyl)]ethane, 1,2-bis[4-(3-aminophenoxy)phenyl]ethane, 1,2-bis[4-(4-aminophenoxy)phenyl]ethane, 1,2-[4-(4-aminophenoxyphenyl)][4-(3-aminophenoxyphenyl)]ethane, 2,2-bis[4-(3-aminophenoxy)phenyl]propane, 2,2-bis[4-(4-aminophenoxy)phenyl]propane, 2,2-[4-(4-aminophenoxyphenyl)][4-(3-aminophenoxyphenyl)]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, 4,4'-bis(4-aminophenoxy)biphenyl, 4,4'-bis(3-aminophenoxy)biphenyl, bis[4-(3-aminophenoxy)phenyl]ketone, bis[4-(4-aminophenoxy)phenyl]ketone, bis[4-(3-aminophenoxy)phenyl]ether, bis[4-(4-aminophenoxy)phenyl]ether, polytetramethylene oxide-di-p-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 2,4-diaminobenzoic acid, 2,5-diaminobenzoic acid, 3,5-diaminobenzoic acid, 3,3'-diamino-4,4'-dicarboxybiphenyl, 4,4'-diamino-3,3'-dicarboxybiphenyl, 4,4'-diamino-2,2'-dicarboxybiphenyl, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 2,2-bis[4-amino-3-carboxyphenyl]hexafluoropropane, 3,3'-diamino-4,4'-dicarboxydiphenyl ether, 4,4'-diamino-3,3'-dicarboxydiphenyl ether, 4,4'-diamino-2,2'-dicarboxydiphenyl ether, 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, 2,3-diaminophenol, 2,4-diaminophenol, 2,5-diaminophenol, and 3,5-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; dihydroxydiphenylmethanes such as 3,3'-diamino-4,4'-dihydroxydiphenylmethane, 4,4'-diamino-3,3'-dihydroxydiphenylmethane, and 4,4'-diamino-2,2'-dihydroxydiphenylmethane; bis[hydroxyphenyl]propanes such as 2,2-bis[3-amino-4-hydroxyphenyl]propane and 2,2-bis[4-amino-3-hydroxyphenyl]propane; bis[hydroxyphenyl]hexafluoropropanes such as 2,2-bis[3-amino-4-hydroxyphenyl]hexafluoropropane and 2,2-bis[3-amino-4-hydroxyphenyl]hexafluoropropane; hydroxydiphenyl ethers such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; dihydroxydiphenyl sulfones such as 3,3'-diamino-4,4'-dihydroxydiphenyl sulfone, 4,4'-diamino-3,3'-dihydroxydiphenyl sulfone, and 4,4'-diamino-2,2'-dihydroxydiphenyl sulfone; dihydroxydiphenyl sulfides such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; dihydroxydiphenyl sulfoxides such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; bis[(hydroxyphenyl)phenyl]alkane compounds such as 2,2-bis[4-(4-amino-3-hydroxyphenoxy)phenyl]propane; bis(hydroxyphenoxy)biphenyl compounds such as 4,4'-bis(4-amino-3-hydroxyphenoxy)biphenyl; bis[(hydroxyphenoxy)phenyl]sulfone compounds such as 2,2-bis[4-(4-amino-3-hydroxyphenoxy)phenyl]sulfone; and bis(hydroxyphenoxy)biphenyl compounds such as 4,4'-diamino-3,3'-dihydroxydiphenylmethane, 4,4'-diamino-2,2'-dihydroxydiphenylmethane, 2,2-bis[3-amino-4-carboxyphenyl]propane, and 4,4'-bis(4-amino-3-hydroxyphenoxy)biphenyl. Those compounds can be used solely, or two or more thereof can be used in combination.

The reaction between the tetracarboxylic acid dianhydride and the diamino compound can be carried out by any method. For example, the reaction can be carried out by any of the following methods (Methods 1 to 3).

Method 1: A solution is prepared in advance by dispersing or dissolving tetracarboxylic acid dianhydride into an organic solvent, and then a diamino compound is added to the solution so as to react the diamino compound with the solution. Thus a polyamide acid solution is prepared. For this reaction, the diamino compound is added so that a total added amount of the diamino compound is not less than 0.50 mol and not more than 1.50 mol with respect to 1 mol of tetracarboxylic acid dianhydride. After the reaction between the tetracarboxylic acid dianhydride and the diamino compound is completed, a resultant polyamide acid solution is imidized by heating the resultant polyamide acid solution to a temperature of not lower than 100° C. and not higher than 300° C., and more preferably to a temperature of not lower than 150° C. and not higher than 250° C.

Method 2: A polyamide acid solution is prepared by a method that is similar to the method described above in the Method 1. An imidization catalyst (tertiary amine such as pyridine, picoline, isoquinoline, trimethylamine, triethylamine, or tributylamine is preferably used) and a dehydrating agent (acetic anhydride or the like) are added to the polyamide acid solution, are heated to not lower than 60° C. and not higher than 180° C., thereby being subjected to imidization.

Method 3: A polyamide acid solution is prepared by a method that is similar to the method described above in the Method 1. The polyamide acid solution thus prepared is put into a vacuum oven which has been heated to a temperature of not lower than 100° C. and not higher than 250° C., and is subjected to imidization by heating and drying the polyamide acid solution in the vacuum oven under vacuum.

<(B) Cross-Linked Polymer Particles, Whose Polymer has Urethane Bond and Carbonate Skeleton in its Molecule>

The (B) cross-linked polymer particles, whose polymer has a urethane bond and a carbonate skeleton in its molecule, in accordance with the present invention, are spherical polymer particles, whose polymer has at least one urethane bond, a carbonate skeleton, and a cross-linked structure in its molecule, having an average particle diameter of not less than 1 μm and not more than 100 μm. The term "spherical" encompass a true spherical shape and an oval shape. An average particle diameter of less than 1 μm increases the viscosity and thixotropy of a resultant resin composition for an insulating film. This may cause an appearance defect due to foaming and/or insufficient leveling of a coating film during coating. Meanwhile, an average particle diameter of more than 100 μm may cause exposure of a particle on a surface of an insulating film produced from a resin composition for an insulating film, which results in poor surface smoothness of the insulating film.

The average particle diameter of the component (B) in accordance with the present invention is preferably not less than 1 μm and not more than 100 μm, more preferably not less than 1 μm and not more than 50 μm, and even more preferably not less than 1 μm and not more than 20 μm. This allows a resultant resin composition for an insulating film to have excellent coating property and allows an insulating film produced from the resin composition for an insulating film to have excellent smoothness and excellent electrical insulation reliability.

The average particle diameter of the component (B) in accordance with the present invention can be obtained, as a median size measured based on volume (which is a particle diameter with respect to 50% of a value of cumulative size distribution), for example, under the following measurement conditions.

(Conditions for Measurement of Average Particle Diameter)

Apparatus used: Equivalent of LA-950V2 manufactured by HORIBA, Ltd.

Measurement method: Laser diffraction/scattering

It is preferable that the component (B) in accordance with the present invention have oil absorbency. This preference is because such an arrangement causes the (A) binder polymer, which forms a matrix of an insulating film produced from a resin composition for an insulating film, to seep into the component (B) and thus achieves high adhesiveness at an interface between the component (A) and the component (B).

An amount of oil absorption of the component (B) in accordance with the present invention can be measured, for example, by a boiled linseed oil method, defined in JIS K 5101-13-2, in which the amount of oil absorption is indicated as how many milliliters of boiled linseed oil (unit: ml/100 g) are absorbed by 100 g of particles of the compound (B). The amount of oil absorption of the component (B) is preferably not less than 50 ml/100 g. This is because such an arrangement achieves high adhesiveness at an interface between the (A) binder polymer and the component (B). In a case where the amount of oil absorption of the component (B) is less than 50 ml/100 g, a matrix component insufficiently seeps into the particles of the component (B), and a poor adhesiveness at the interface therefore is caused, which may reduce flexibility of a resultant insulating film. An upper limit of the amount of oil absorption is not particularly limited. However, in a case where the amount of oil absorption is more than 500 ml/100 g, the viscosity of a resultant resin composition for an insulating film becomes high. This may, in some cases, cause an appearance defect due to foaming and/or insufficient leveling of a coating film during coating. Accordingly, it is particularly preferable that the amount of oil absorption of the component (B) is not less than 50 ml/100 g and not more than 500 ml/100 g.

A method of preparing the component (B) in accordance with the present invention is not particularly limited, but examples of the method encompass a method of (i) preparing a suspension in which polymer particles are dispersed in water by adding a polyol component and a polyisocyanate component to water, dispersing these components in particulate form, and reacting these components, and subsequently (ii) separating a liquid from the suspension thus prepared and then drying and solidifying the liquid to obtain polymer particles.

By using, as the polyol component in accordance with the present invention, a polycarbonate diol represented by General Formula (7):

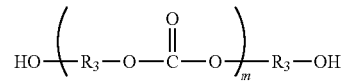

General Formula (7)

where each $R_3$ independently represent a divalent organic group, and m represents an integer of 1 to 20, it is possible to introduce a carbonate skeleton into a molecule of the component (B). This allows an insulating film produced from the resin composition for an insulating film to have excellent hydrolysis resistance. It is thus possible to obtain an insulating film having excellent electrical insulation reliability at high temperature and high humidity, without sacrificing the flexibility and folding endurance.

The polycarbonate diol in accordance with the present invention is not particularly limited to any specific one as long as it has the structure represented by General Formula (7) above. Examples of the polycarbonate diol encompass the following commercial products: trade names PCDL T-4671, T-4672, T-4691, T-4692, T-5650J, T-5651, T-5652, T-6001, and T-6002, each of which is manufactured by Asahi Kasei Chemicals Corporation; trade names PLACCEL CD205, CD205PL, CD205HL, CD210, CD210PL, CD210HL, CD220, CD220PL, and CD220HL, each of which is manufactured by Daicel Chemical Industries, Ltd.; trade names Kuraray Polyol C-1015N, C-1050, C-1065N, C-1090, C-2015N, C-2065N, and C-2090, each of which is manufactured by Kuraray Co., Ltd.; and trade names NIPPOLLAN 981, 980R, and 982R, each of which is manufactured by Nippon Polyurethane Industry Co., Ltd. These products can be used solely, or two or more types thereof can be used in combination.

The polycarbonate diol has a number-average molecular weight of preferably not less than 500 and not more than 5,000, and more preferably not less than 750 and not more than 2,500. The number-average molecular weight of the polycarbonate diol is preferably within the range from 500 to 5,000. This is because such an arrangement allows an insulating film produced from a resultant resin composition for an insulating film to be improved in chemical resistance and flexibility.

The polyol component in accordance with the present invention may be polyol other than the above polycarbonate diol. The polyol in accordance with the present invention is not particularly limited to any specific one. Examples of the polyol encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,7-heptanediol, 1,8-octanediol, 2-methyl-1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol and polybasic acid; a polycarbonate diol having a carbonate skeleton; a polycaprolactone diol obtained by carrying out ring opening addition of lactones such as γ-butyl lactone, ε-caprolactone, and δ-valerolactone; diols such as bisphenol A, an ethylene oxide adduct of bisphenol A, a propylene oxide adduct of bisphenol A, hydrogenated bisphenol A, an ethylene oxide adduct of hydrogenated bisphenol A, and a propylene oxide adduct of hydrogenated bisphenol A; trifunctional polyols such as glycerol, trimethylolpropane, and 1,2,6-hexanetriol; tetrafunctional polyols such as pentaerythritol; and hexafunctional polyols such as dipentaerythritol. These compounds can be used solely, or two or more thereof can be used in combination.

In a case where a diol such as polycarbonate diol is employed as the polyol component, the polyisocyanate component in accordance with the present invention needs to be trifunctional or higher functional polyisocyanate so that the component (B) forms a cross-linked structure. The trifunctional or higher functional polyisocyanate is not particularly limited to any specific one. Examples of such a polyisocyanate encompass isocyanurate type polyisocyanate, biuret type polyisocyanate, and adduct type polyisocyanate. These polyisocyanates can be used solely, or two or more types thereof can be used in combination. Examples of the isocyanurate type polyisocyanate encompass Duranate™ TPA-100 and Duranate™ THA-100 (product names) manufactured by Asahi Kasei Chemicals Corporation. Examples of the biuret type multifunctional polyisocyanate encompass Duranate™ 24A-100 and Duranate™ 22A-75PX (product names) manufactured by Asahi Kasei Chemicals Corporation. Examples of the adduct type multifunctional polyisocyanate encompass Duranate™ P-301-75E and Duranate™ E-402-90T (product names) manufactured by Asahi Kasei Chemicals Corporation. In the manufacture of the component (B) in accordance with the present invention, the diisocyanate compound exemplified as a compound used for synthesis of the resin having a (a1) urethane bond in accordance with the present invention can be used in combination, instead of the aforementioned polyisocyanate.

The component (B) in accordance with the present invention is contained in an amount preferably of, with respect to 100 parts by weight of the component (A), not smaller than 30 parts by weight and not larger than 100 parts by weight, and more preferably of not smaller than 40 parts by weight and not larger than 80 parts by weight. This arrangement allows irregularities to be effectively formed at a surface of the insulating film produced, thus allowing the insulating film to have excellent tack property. The above arrangement also allows the component (B) to produce a filling effect, thus decreasing warpage of the insulating film. The above arrangement further improves, for example, a stress relaxing effect and fracture toughness of the insulating film, thus improving flexibility of being able to resist repeated foldings. Containing the component (B) in an amount of smaller than 30 parts by weight may cause a decrease in tack property and/or flexibility of being able to resist repeated foldings. Containing the component (B) in an amount of larger than 100 parts by weight may (i) cause a decrease in coating property at the time of coating a surface of a substrate with a resin composition solution for an insulating film, and consequently (ii) cause an appearance defect due to foaming and/or insufficient leveling of a coating film during coating.

<(C) Thermosetting Resin>

The "(C) thermosetting resin" in accordance with the present invention is a compound having such a structure that at least one thermosetting organic group is contained in its molecule.

The component (C) in accordance with the present invention is not particularly limited as long as it has the above structure. Examples of the component (C) encompass: epoxy resin; oxetane resin; phenol resin; isocyanate resin; block isocyanate resin; bismaleimide resin; bisallylnadiimide resin; polyester resin (e.g., unsaturated polyester resin); diallylphthalate resin; silicon resin; venylester resin; melamine resin; polybismaleimide triazine resin (BT resin); cyanate resin (e.g., cyanate ester resin); urea resin; guanamine resin; sulfonamide resin; aniline resin; polyurea resin; thiourethane resin; polyazomethine resin; episulphide resin; enethiol resin; benzoxazine resin; copolymer resins thereof; modified resins thereof, which are prepared by modifying those resins; and mixtures of those resins or mixtures of one or more resins with (an)other resin(s).

Among the above thermosetting resins, it is particularly preferable to use epoxy resin as the component (C) in accordance with the present invention. This is because the epoxy resin can impart, to an insulating film produced from a resultant resin composition for an insulating film, not only a heat resistance but also adhesiveness with respect to (i) a conductor (such as metallic foil) and (ii) a circuit substrate.

The above epoxy resin is a compound having such a structure that at least one epoxy group is contained in its molecule, and the above epoxy resin is not particularly limited to any specific one. Examples of the epoxy resin encompass bisphenol A type epoxy resins, bisphenol F type epoxy resins, bisphenol S type epoxy resins, hydrogenated bisphenol A type epoxy resins, biphenyl type epoxy resins, phenoxy type epoxy resins, naphthalene type epoxy resins, phenol novolac type epoxy resins, cresol novolac type epoxy resins, trisphenolmethane type epoxy resins, dicyclopentadiene type epoxy resins, amine type epoxy resins, flexible epoxy resins, urethane-denatured epoxy resins, rubber-denatured epoxy resins, chelate-denatured epoxy resins, and heterocycle-containing epoxy resins.

Specifically, examples of the bisphenol A type epoxy resins encompass: jER 828, jER 1001, and jER 1002 (trade names) manufactured by Japan Epoxy Resins Co., Ltd.; ADEKA RESIN EP-4100E and ADEKA RESIN EP-4300E (trade names) manufactured by ADEKA Corporation; RE-3105 and RE-410S (trade names) manufactured by Nippon Kayaku Co., Ltd.; EPICLON 840S, EPICLON 850S, EPICLON 1050, and EPICLON 7050 (trade names) manufactured by Dainippon Ink and Chemicals Inc.; and EPOTOHTO YD-115, EPOTOHTO YD-127, and EPOTOHTO YD-128 (trade names) manufactured by Tohto Kasei Co., Ltd. Examples of the bisphenol F type epoxy resins encompass: jER 806 and jER 807 (trade names) manufactured by Japan Epoxy Resins Co., Ltd.; ADEKA RESIN EP-4901E, ADEKA RESIN EP-4930, and ADEKA RESIN EP-4950 (trade names) manufactured by ADEKA Corporation; RE-3035, RE-3045, RE-4035, and RE-4045 (trade names) manufactured by Nippon Kayaku Co., Ltd.; EPICLON 830 and EPICLON 835 (trade names) manufactured by Dainippon Ink and Chemicals Inc.; and EPOTOHTO YDF-170, EPOTOHTO YDF-1755, and EPOTOHTO YDF-2001 (trade names) manufactured by Tohto Kasei Co., Ltd. Examples of the bisphenol S type epoxy resins encompass EPICLON EXA-1514 (trade name) manufactured by Dainippon Ink and Chemicals Inc. Examples of the hydrogenated bisphenol A type epoxy resins encompass: jERYX 8000, jERYX 8034, and jERYL 7170 (trade names) manufactured by Japan Epoxy Resins Co., Ltd.; ADEKA RESIN EP-4080E (trade name) manufactured by ADEKA Corporation; EPICLON EXA-7015 (trade name) manufactured by Dainippon Ink and Chemicals Inc.; and EPOTOHTO YD-3000 and EPOTOHTO YD-4000D (trade names) manufactured by Tohto Kasei Co., Ltd. Examples of the biphenyl type epoxy resins encompass: jERYX 4000, jERYL 6121H, jERYL 6640, and jERYL 6677 (trade names) manufactured by Japan Epoxy Resins Co., Ltd.; and NC-3000 and NC-3000H (trade names) manufactured by Nippon Kayaku Co., Ltd. Examples of the phenoxy type epoxy resins encompass jER 1256, jER 4250, and jER 4275 (trade names) manufactured by Japan Epoxy Resins Co., Ltd. Examples of the naphthalene type epoxy resins encompass: EPICLON HP-4032, EPICLON HP-4700, and EPICLON HP-4200 (trade names) manufactured by Dainippon Ink and Chemicals Inc.; and NC-7000L (trade name) manufactured by Nippon Kayaku Co., Ltd. Examples of the phenol novolac type epoxy resins encompass: jER 152 and jER 154 (trade names) manufactured by Japan Epoxy Resins Co., Ltd.; EPPN-201-L (trade name) manufactured by Nippon Kayaku Co., Ltd.; EPICLON N-740 and EPICLON N-770 (trade names) manufactured by Dainippon Ink and Chemicals Inc.; and EPOTOHTO YDPN-638 (trade name) manufactured by Tohto Kasei Co., Ltd. Examples of the cresol novolac type epoxy resins encompass: EOCN-1020, EOCN-102S, EOCN-103S, and EOCN-104S (trade names) manufactured by Nippon Kayaku Co., Ltd.; and EPICLON N-660, EPICLON N-670, EPICLON N-680, and EPICLON N-695 (trade names) manufactured by Dainippon Ink and Chemicals Inc. Examples of the trisphenolmethane type epoxy resins encompass EPPN-501H, EPPN-501HY, and EPPN-502H (trade names) manufactured by Nippon Kayaku Co., Ltd. Examples of the dicyclopentadiene type epoxy resins encompass: XD-1000 (trade name) manufactured by Nippon Kayaku Co., Ltd.; and EPICLON HP-7200 (trade name) manufactured by Dainippon Ink and Chemicals Inc. Examples of the amine type epoxy resins encompass: jER 604 and jER 630 (trade names) manufactured by Japan Epoxy Resins Co., Ltd.; EPOTOHTO YH-434 and EPOTOHTO YH-434L (trade names) manufactured by Tohto Kasei Co., Ltd.; and TETRAD-X and TERRAD-C (trade names) manufactured by Mitsubishi Gas Chemical Co., Inc. Examples of the flexible epoxy resins encompass: jER 871, jER 872, jERYL 7175, and jERYL 7217 (trade names) manufactured by Japan Epoxy Resins Co., Ltd.; and EPICLON EXA-4850 (trade name) manufactured by Dainippon Ink and Chemicals Inc. Examples of the urethane-denatured epoxy resins encompass: ADEKA RESIN EPU-6, ADEKA RESIN EPU-73, and ADEKA RESIN EPU-78-11 (trade names) manufactured by ADEKA Corporation. Examples of the rubber-denatured epoxy resins encompass: ADEKA RESIN EPR-4023, ADEKA RESIN EPR-4026, and ADEKA RESIN EPR-1309 (trade names) manufactured by ADEKA Corporation. Examples of the chelate-denatured epoxy resins encompass ADEKA RESIN EP-49-10 and ADEKA RESIN EP-49-20 (trade names) manufactured by ADEKA Corporation. Examples of the heterocycle-containing epoxy resins encompass TEPIC (triglycidylisocyanurate) (trade name) manufactured by Nissan Chemical Industries, Ltd. As the component (C) of the present invention, these resins can be used solely, or two or more types thereof can be used in combination.

A curing agent contained in the resin composition for an insulating film in accordance with the present invention and used for the thermosetting resin is not particularly limited to any specific one. Examples of the curing agent encompass: a phenolic resin such as phenol novolac resin, cresol novolac resin, and naphthalene type phenolic resin; amino resin; urea resin; melamine; and dicyandiamide. These curing agents can be used solely, or two or more types thereof can be used in combination.

A curing accelerator contained in the resin composition for an insulating film in accordance with the present invention and used for the thermosetting resin is not particularly limited to any specific one. Examples of the curing accelerator encompass: phosphine-based compounds such as triphenylphosphine; amine-based compounds such as tertiary amine, trimethanolamine, triethanolamine, and tetraethanolamine; borate-based compounds such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. These curing accelerators can be used solely, or two or more types thereof can be used in combination.

The component (C) in accordance with the present invention is contained in an amount of, with respect to 100 parts by weight of the component (A), preferably not smaller than 1 parts by weight and not larger than 100 parts by weight, and more preferably not smaller than 5 parts by weight and not larger than 50 parts by weight. This arrangement allows an insulating film (cured film) produced from a resultant resin composition for an insulating film to be excellent in electrical insulation reliability, heat resistance, and folding endurance. Containing the component (C) in an amount of smaller than 1 part by weight may cause a decrease in electrical insulation reliability and heat resistance. Containing the component (C) in an amount of larger than 100 parts by weight may cause a decrease in folding endurance.

<(D) Compound Having a Radically Polymerizable Group>in its Molecule

The (D) compound having a radically polymerizable group in its molecule, in accordance with the present invention, is a compound containing at least one radically polymerizable group, in its molecule, of which a polymerization reaction proceeds with use of a radical polymerization initiator. Among the above compounds, a compound in which the radically polymerizable group has unsaturated double bond is preferable. Further, the unsaturated double bond is preferably a (meth)acryloyl group or a vinyl group. The use of the (D) compound having a radically polymerizable group in its molecule allows a resin composition for an insulating film in accordance with the present invention to be a photosensitive resin composition for an insulating film. This makes it possible to subject the resin composition for an insulating film to microfabrication by light exposure and development.

The (D) compound having a radically polymerizable group in its molecule is not particularly limited to any specific one. Examples of such a compound encompass radically polymerizable monomers including: bisphenol F EO-denatured (n=2 to 50) diacrylate; bisphenol A EO-denatured (n=2 to 50) diacrylate; bisphenol S EO-denatured (n=2 to 50) diacrylate; bisphenol F EO-denatured (n=2 to 50) dimethacrylate; bisphenol A EO-denatured (n=2 to 50) dimethacrylate; bisphenol S EO-denatured (n=2 to 50) dimethacrylate; 1,6-hexanediol diacrylate; neopentyl glycol diacrylate; ethylene glycol diacrylate; pentaerythritol diacrylate; trimethylolpropane triacrylate; pentaerythritol triacrylate; dipentaerythritol hexaacyrlate; tetramethylolpropane tetraacrylate; tetraethylene glycol diacrylate; 1,6-hexanediol dimethacrylate; neopentyl glycol dimethacrylate; ethylene glycol dimethacrylate; pentaerythritol dimethacrylate; trimethylolpropane trimethacrylate; pentaerythritol trimethacrylate; dipentaerythritol hexamethacrylate; tetramethylolpropane tetramethacrylate; tetraethylene glycol dimethacrylate; methoxy diethylene glycol methacrylate; methoxy polyethylene glycol methacrylate; β-methacryloyloxyethyl hydrogen phthalate; β-methacryloyloxyethyl hydrogen succinate; 3-chloro-2-hydroxypropyl methacrylate; stearyl methacrylate; phenoxyethyl acrylate; phenoxydiethylene glycol acrylate; phenoxypolyethylene glycol acrylate; β-acryloyloxyethyl hydrogen succinate; lauryl acrylate; ethylene glycol dimethacrylate; diethylene glycol dimethacrylate; triethylene glycol dimethacrylate; polyethylene glycol dimethacrylate; 1,3-butylene glycol dimethacrylate; 1,6-hexanediol dimethacrylate; neopentyl glycol dimethacrylate; polypropylene glycol dimethacrylate; 2-hydroxy-1,3-dimethacryloxypropane; 2,2-bis[4-(methacryloxyethoxy)phenyl]propane; 2,2-bis[4-(methacryloxy diethoxy)phenyl]propane; 2,2-bis[4-(methacryloxy polyethoxy)phenyl]propane; polyethylene glycol diacrylate; tripropylene glycol diacrylate; polypropylene glycol diacrylate; 2,2-bis[4-(acryloxy diethoxy)phenyl]propane; 2,2-bis[4-(acryloxy polyethoxy)phenyl]propane; 2-hydroxy-1-acryloxy-3-methacryloxypropane; trimethylolpropane trimethacrylate; tetramethylolmethane triacrylate; tetramethylolmethane tetraacrylate; methoxydipropylene glycol methacrylate; methoxytriethylene glycol acrylate; nonylphenoxypolyethylene glycol acrylate; nonylphenoxypolypropylene glycol acrylate; 1-acryloyloxypropyl-2-phthalate; isostearyl acrylate; polyoxyethylenealkyl ether acrylate; nonylphenoxyethylene glycol acrylate; polypropylene glycol dimethacrylate; 1,4-butanediol dimethacrylate; 3-methyl-1,5-pentanediol dimethacrylate; 1,6-hexanediol dimethacrylate; 1,9-nonanediol dimethacrylate; 2,4-diethyl-1,5-pentanediol dimethacrylate; 1,4-cyclohexane dimethanol dimethacrylate; dipropylene glycol diacrylate; tricyclodecane dimethanol diacrylate; 2,2-hydrogenated bis[4-(acryloxy polyethoxy)phenyl]propane; 2,2-bis[4-(acryloxy polypropoxy)phenyl]propane; 2,4-diethyl-1,5-pentanediol diacrylate; ethoxylated trimethylolpropane triacrylate; propoxylated trimethylolpropane triacrylate; isocyanuric acid tri (ethane acrylate); pentaerythritol tetraacrylate; ethoxylated pentaerythritol tetraacrylate; propoxylated pentaerythritol tetraacrylate; ditrimethylolpropane tetraacrylate; dipentaerythritol polyacrylate; triallyl isocyanurate; glycidyl methacrylate; glycidyl allyl ether; 1,3,5-triacryloylhexahydro-s-triazine; triallyl 1,3-5-benzenecarboxylate; triallylamine; triallyl citrate; triallyl phosphate; allobarbital; diallylamine; diallyl dimethyl silane; diallyl disulfide; diallyl ether; diallyl isophthalate; diallyl terephthalate; 1,3-diallyloxy-2-propanol; diallyl sulfide diallyl maleate; 4,4'-isopropylidene diphenol dimethacrylate; and 4,4'-isopropylidene diphenol diacrylate. These compounds can be used solely, or two or more types thereof can be used in combination. Preferably, the compound having a radically polymerizable group in its molecule is, in particular, a compound containing 2 to 50 mol of a repeating unit of EO (ethylene oxide) in a single molecule of diacrylate or dimethacrylate. This arrangement (i) improves solubility of the resultant resin composition for an insulating film in an aqueous developing solution (which is typically represented by an alkaline aqueous solution) and (ii) reduces the developing time.

Alternatively, the compound having a radically polymerizable group in its molecule can be, for example, acid-modified epoxy acrylate. The acid-modified epoxy acrylate is obtained by adding saturated or unsaturated polyvalent carboxylic acid anhydride to a reactant which is obtained by reacting an epoxy compound with unsaturated monocarboxylic acid. Further alternatively, the compound having a radically polymerizable group in its molecule can be urethane acrylate which is a polymer of (i) a diol compound having an unsaturated ethylene group and/or a carboxyl group and (ii) a diisocyanate compound. Still further alternatively, the compound having a radically polymerizable group in its molecule can be a resin containing a radically polymerizable group, such as an acrylated acrylate, obtained by copolymerizing (i) a (meth)acrylic acid having a carboxyl group and a double bond capable of copolymerization and (ii) a (meth)acrylic ester or the like to obtain a copolymer, and then reacting a part of the carboxyl groups on a side chain of the copolymer with an epoxy group which is contained in a compound, such as glycidyl methacrylate, having a (meth)acrylic group and the epoxy group. Examples of the acid-modified epoxy acrylate encompass ZFR series, ZAR series, ZCR series, CCR series, and PCR series each of which is manufactured by Nippon Kayaku Co., Ltd. Examples of the urethane acrylate encompass UXE series produced by Nippon Kayaku Co., Ltd. Examples of the acrylated acrylate encompass Cyclomer ACA series produced by DAICEL-CYTEC Company Ltd. The resin containing a radically polymerizable group may be used solely or may be used in combination with the radically polymerizable monomer.

The component (D) in accordance with the present invention is contained in an amount preferably of, with respect to 100 parts by weight of the component (A), not smaller than 1 parts by weight and not larger than 500 parts by weight, and more preferably of not smaller than 5 parts by weight and not larger than 300 parts by weight. This arrangement allows an insulating film (cured film) produced from a resultant resin composition for an insulating film to be excellent in photosensitivity, electrical insulation reliability, and folding endurance. Containing the component (D) in an amount of smaller than 1 part by weight may cause a decrease in photosensitivity. Containing the component (D) in an amount of larger than 500 parts by weight may cause a decrease in folding endurance.

<(E) Photo-Polymerization Initiator>

The (E) photo-polymerization initiator in accordance with the present invention is a compound that is activated by energy such as UV energy and that starts and accelerates a reaction of a radically polymerizable group. The use of the (E) photo-polymerization initiator in combination with the (D) compound having a radically polymerizable group in its molecule allows a resin composition for an insulating film in accordance with the present invention to be a photosensitive resin composition for an insulating film. This makes it possible to subject the resin composition for an insulating film to microfabrication by light exposure and development.

The component (E) in the present invention is not particularly limited to any specific one as long as it is a compound having the aforementioned function. Examples of the component (E) encompass: Michler's ketone; 4,4'-bis(diethylamino)benzophenone; 4,4',4"-tris(dimethylamino)triphenylmethane; 2,2'-bis(2-chlorophenyl)-4,4',5,5'-tetraphenyl-1,2'-diimidazole; acetophenone; benzoin; 2-methylbenzoin; benzoin methyl ether; benzoin ethyl ether; benzoin isopropyl ether; benzoin isobutyl ether; 2-t-butylanthraquinone; 1,2-benzo-9,10-anthraquinone; methylanthraquinone; thioxanthone; 2,4-diethylthioxanthone; 2-isopropylthioxanthone; 1-hydroxycyclohexyl phenyl ketone; diacetylbenzyl; benzyl dimethyl ketal; benzyl diethyl ketal; 2-(2'-furilethylidene)-4,6-bis(trichloromethyl)-S-triazine; 2-[2'(5"-methylfuril) ethylidene]-4,6-bis(trichloromethyl)-S-triazine; 2-(p-methoxyphenyl)-4,6-bis(trichloromethyl)-S-triazine; 2,6-di(p-azidobenzal)-4-methylcyclohexanone; 4,4'-diazidochalcon; di(tetraalkylammonium)-4,4'-diazidostilbene-2,2'-disulfonate; 2,2-dimethoxy-1,2-diphenylethane-1-one; 1-hydroxy-cyclohexyl-phenyl-ketone; 2-hydroxy-2-methyl-1-phenyl-propane-1-one; 1-[4-(2-hydroxyethoxy)-phenyl]-2-hydroxy-2-methyl-1-propane-1-one; 2-methyl-1-[4-(methylthio)phenyl]-2-morpholinopropane-1-one; 2-benzyl-2-dimethylamino-1-(4-morpholinophenyl)-butane-1-one; bis(2,4,6-trimethylbenzoyl)-phenylphosphine oxide; bis(2,6-dimethoxybenzoyl)-2,4,4-trimethyl-pentylphosphine oxide; 2,4,6-trimethylbenzoyl-diphenyl-phosphine oxide;

2-hydroxy-2-methyl-1-phenyl-propane-1-ketone; bis(η-5,2, 4-cyclopentadiene-1-yl)-bis(2,6-difluoro-3-(1H-pyrrole-1-yl)-phenyl)titanium; 1,2-octanonedione; 1-[4-(phenylthio)-2-(O-benzoyloxime)]; iodonium; (4-methylphenyl)[4-(2-methylpropyl)phenyl]-hexafluorophosphate(1-); ethyl-4-dimethylaminobenzoate; 2-ethylhexyl-4-dimethylaminobenzoate; ethanone; and 1-[9-ethyl-6-(2-methylbenzoyl)-9H-carbazol-3-yl]-1-(O-acetyloxime). These compounds can be used solely, or two or more types thereof can be used in combination.

The component (E) in accordance with the present invention is contained in an amount preferably of not smaller than 0.1 part by weight and not larger than 10 parts by weight, and more preferably of not smaller than 0.5 part by weight and not larger than 10 parts by weight, with respect to 100 parts by weight of the component (A). This arrangement allows an insulating film (cured film) produced from a resin composition for an insulating film to have excellent photosensitivity and to cause outgassing in a smaller amount. Containing the component (E) in an amount of smaller than 0.1 part by weight may cause the resin composition to be poor in photosensitivity, and containing the component (E) in an amount of larger than 10 parts by weight may cause outgassing in a large amount in the resin composition.

<(F) Phosphoric Flame Retardant>

The (F) phosphoric flame retardant in accordance with the present invention is a compound that contains at least one elemental phosphorus in its molecule and has an effect of suppressing burning of organic matter.

The component (F) in accordance with the present invention is not particularly limited to any specific one as long as it has the above structure. Examples of the component (F) encompass red phosphorus, a condensed phosphoric ester compound, a cyclic organic phosphorus compound, a phosphazene compound, a phosphorus-containing (meth)acrylate compound, a phosphorus-containing epoxy compound, a phosphorus-containing polyol compound, a phosphorus-containing amine compound, polyphosphate ammonium, melamine phosphate, and phosphinate. These components can be used solely, or two or more thereof can be used in combination.

The component (F) in accordance with the present invention is preferably phosphinate in particular, among the above phosphoric flame retardants. This arrangement makes it possible to impart excellent flame retardancy to a resultant insulating film and causes only a little bleedout from the insulating film, thus making it possible to prevent a contact fault and pollution during a process.

The phosphinate in accordance with the present invention is a compound represented by General Formula (8):

General Formula (8)

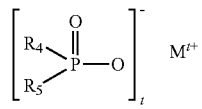

where, $R_4$ and $R_5$ each independently represent a linear or branched alkyl group or aryl group having 1 to 6 carbon atoms; M represents at least one metal selected from the group consisting of Mg, Ca, Al, Sb, Sn, Ge, Ti, Fe, Zr, Zn, Ce, Bi, Sr, Mn, Li, Na, and K; and t represents an integer of 1 to 4.

The phosphinate in accordance with the present invention is not particularly limited to any specific one as long as it has the structure represented by General Formula (8) above.

Examples of the phosphinate encompass: aluminum trisdiethylphosphinate; aluminum trismethylethylphosphinate; aluminum trisdiphenylphosphinate; zinc bisdiethylphosphinate; zinc bismethylethylphosphinate; zinc bisdiphenylphosphinate; titanyl bisdiethylphosphinate; titanyl bismethylethylphosphinate; and titanyl bisdiphenylphosphinate. These phosphinates can be used solely, or two or more types thereof can be used in combination. The phosphinate in accordance with the present invention is preferably aluminum trisdiethylphosphinate or aluminum trismethylethylphosphinate in particular, among the above phosphinates. This preference is because such an arrangement allows a resultant insulating film to have high flame retardancy.

The component (F) in accordance with the present invention is contained in an amount preferably of, with respect to 100 parts by weight of the component (A), not smaller than 5 parts by weight and not larger than 100 parts by weight, and more preferably of not smaller than 10 parts by weight and not larger than 50 parts by weight. This arrangement allows an insulating film produced from a resultant resin composition for an insulating film to be excellent in flame retardancy and electrical insulation reliability. Containing the component (F) in an amount of smaller than 5 parts by weight may cause a decrease in flame retardancy. Containing the component (F) in an amount of larger than 100 parts by weight may (i) causes a decrease in folding endurance, (ii) cause a decrease in coating property at the coating of a resin composition for an insulating film, and consequently (iii) cause an appearance defect due to foaming and/or insufficient leveling of a coating film during coating.

<Other Components>

The resin composition for an insulating film in accordance with the present invention can further contain, as necessary, various additives such as a filler, an adhesion promoting agent, a defoaming agent, a leveling agent, a coloring agent, and a polymerization inhibitor.

Example of the filler encompass fine inorganic fillers such as silica, mica, talc, barium sulfate, wollastonite, and calcium carbonate.

Examples of the defoaming agent encompass acryl-based compounds, vinyl-based compounds, and butadiene-based compounds.

Examples of the leveling agent encompass an acryl-based compound and a vinyl-based compound.

Examples of the coloring agent encompass a phthalocyanine-based compound, an azo-based compound, and carbon black.

Examples of the adhesion promoting agent (also called an adhesion promoter) encompass a silane coupling agent, a triazole-based compound, a tetrazole-based compound, and a triazine-based compound.

Examples of the polymerization inhibitor encompass hydroquinone and hydroquinone monomethylether.

The resin composition for an insulating film in accordance with the present invention may contain, as necessary, a flame retardant to obtain a higher flame retardant effect. Examples of the flame retardant encompass a halogen-based compound, a metal hydroxide, and a melamine-based compound. Those various additives can be used solely, or two or more types thereof can be used in combination.

<Method of Preparing Resin Composition for Insulating Film>

It is possible to prepare the resin composition for an insulating film in accordance with the present invention by grinding and dispersing the components (A) through (F) and (an) other component(s) and then mixing them. A method of grinding and dispersing those components is not particularly limited, and is carried out with use of, for example, a general kneading machine such as a beads-mill, a ball mill, or a triple-roll mill. It is particularly preferable to use the beads-mill to grind and disperse the components to mix them because a particle size distribution of the component (B), which exists as fine particles, becomes uniform.

The following is an example of grinding and dispersing the components employed in the present invention with use of a beads-mill. First, the components (A) through (F) and (an) other component(s), and a solvent as necessary are mixed with one another to obtain a mixture. Subsequently, beads are added to the mixture thus obtained. A resultant mixture is agitated with use of a predetermined device and then sheared. In this manner, the components, which are fine particles, employed in the present invention can be ground and dispersed for mixture. Examples of the kinds of the above beads encompass zirconia, zircon, glass, and titania. However, from among these beads, beads suitable for a target particle diameter and for an intended use may be selected and employed. A particle diameter of the beads is not particularly limited to any specific one, and beads suitable for a target particle diameter may be employed. An agitating speed (circumferential speed) of the device varies by device. However, the mixture may be agitated at a rate of 100 rpm to 3000 rpm. If the agitating speed becomes higher, a temperature of the mixture will be raised. In such a case, the rise in temperature of the mixture may be suppressed by flowing cooling water or a coolant as appropriate. When the component (B) obtains a desired particle diameter, the beads are then filtered. Thus, the resin composition for an insulating film in accordance with the present invention can be prepared. The particle diameter of the fine particles contained in the resin composition for an insulating film in accordance with the present invention can be measured by a method involving a gauge which is defined by JIS K 5600-2-5. Further, with use of a particle size distribution measurement device, it is possible to measure an average particle diameter, a particle diameter, and a particle size distribution of the fine particles contained in the resin composition for an insulating film in accordance with the present invention.

(II) Method of Using Resin Composition for Insulating Film

The resin composition for an insulating film in accordance with the present invention can be directly formed into an insulating film, or can be formed into an insulating film after the preparation of a resin composition solution for an insulating film, in the following manner. Initially, the resin composition or the resin composition solution is applied to a substrate and then dried so as to remove an organic solvent. The application of the resin composition or the resin composition solution to the substrate may be carried out by screen printing, curtain rolling, reverse rolling, spray coating, rotational application by use of a spinner, or the like. A coating film as applied (having a thickness of preferably not less than 5 μm and not more than 100 μm, particularly preferably not less than 10 μm and not more than 100 μm) is dried at a temperature of not higher than 120° C., preferably at a temperature of not lower than 40° C. and not higher than 100° C.

Next, the coating film thus obtained is subjected to a heat treatment. By carrying out the heat treatment, and then reacting residual reactive groups with each other in a molecular structure of the resin composition for an insulating film, it is possible to prepare an insulating film having excellent heat resistance. A thickness of the insulating film is determined in consideration of a thickness of wiring lines and the like, but is preferably about not less than 2 μm and not more than 50 μm.

As for a final curing temperature in the heat treatment, it is desirable that the film be cured by heating at lower temperatures so as to prevent (i) oxidization of the wiring lines and the like and (ii) decrease in adhesiveness of the wiring lines to a base material.

The curing temperature in the heat treatment is preferably not lower than 100° C. and not higher than 250° C., further preferably not lower than 120° C. and not higher than 200° C., particularly preferably not lower than 130° C. and not higher than 180° C. It is not preferable that a final heat temperature be higher than 250° C., because deterioration of the wiring lines due to oxidation is promoted.

The following will describe a method of using the resin composition for an insulating film in accordance with the present invention in a case where the resin composition for an insulating film in accordance with the present invention is a photosensitive resin composition for an insulating film, which photosensitive resin composition contains one of the (D) compound having a radically polymerizable group in its molecule and the (E) photo-polymerization initiator.

The resin composition for an insulating film in accordance with the present invention can be directly formed into an insulating film or a relief pattern, or can be formed into an insulating film or a relief pattern after the preparation of a resin composition solution for an insulating film, in the following manner. Initially, the resin composition or the resin composition solution is applied to a substrate and then dried so as to remove an organic solvent. The application of the resin composition or the resin composition solution to the substrate may be carried out by screen printing, curtain rolling, reverse rolling, spray coating, rotational application by use of a spinner, or the like. A coating film as applied (having a thickness of preferably not less than 5 μm and not more than 100 μm, particularly preferably not less than 10 μm and not more than 100 μm) is dried at a temperature of not higher than 120° C., preferably at a temperature of not lower than 40° C. and not higher than 100° C.

After the coating film is dried, a negative photomask is placed on the coating film thus dried, and is irradiated with active light such as ultraviolet rays, visible light, or electron beams. Then, a portion, in the coating film, which is not exposed to light is washed with a developing solution by a method such as a shower method, a paddle method, a soaking method, an ultrasonic method, or the like method so as to form a relief pattern. Since a time required for the pattern to be exposed differs depending on spray pressure and flow speed of the developing device, a temperature of the etching solution, and others, it is desirable to find an optimum condition for the device as appropriate.

As the developing solution, an alkaline aqueous solution is preferably used. The developing solution may contain a water-soluble organic solvent such as methanol, ethanol, n-propanol, isopropanol, or N-methyl-2-pyrrolidone. Examples of alkaline compounds for use in preparation of the alkaline aqueous solution encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. Further, any other compounds are obviously usable as long as the aqueous solution exhibits basicity. The alkaline aqueous solution preferably used in the step of developing the resin composition for an insulating film in accordance with the present invention has an alkaline compound concentration of preferably not less than 0.01% by weight and not more than 20% by weight, particularly preferably 0.02% by weight to 10% by weight. A temperature of the developing solution may be set as appropriate according to a composition of the resin composition for an insulating film or a composition of the alkaline developing solution. Generally, the temperature of the developing solution is preferably not lower than 0° C. and not higher than 80° C., and more preferably not lower than 10° C. and not higher than 60° C.

The relief pattern thus formed in the developing step is cleaned to remove unnecessary residues of the developing solution. Examples of a cleaning solution for use in the cleaning encompass water and an acidic aqueous solution.

Next, the relief pattern thus obtained is subjected to a heat treatment. By carrying out the heat treatment, and then reacting residual reactive groups with each other in a molecular structure of the resin composition for an insulating film, it is possible to prepare an insulating film having excellent heat resistance. A thickness of the insulating film is determined in consideration of a thickness of wiring lines and the like, but is preferably about not less than 2 μm and not more than 50 μm. As for a final curing temperature in the heat treatment, it is desirable that the film be cured by heating at lower temperatures so as to prevent (i) oxidization of the wiring lines and the like and (ii) decrease in adhesiveness of the wiring lines to a base material.

The curing temperature in the heat treatment is preferably not lower than 100° C. and not higher than 250° C., further preferably not lower than 120° C. and not higher than 200° C., particularly preferably not lower than 130° C. and not higher than 180° C. It is not preferable that a final heat temperature be higher than 250° C., because deterioration of the wiring lines due to oxidation is promoted.

An insulating film formed from the resin composition for an insulating film in accordance with the present invention has excellent flexibility and excellent electrical insulation reliability, and a substrate upon curing has a small warpage.

In addition, the insulating film prepared from the resin composition for an insulating film suitably has, for example, a film thickness of the order of not less than 2 μm and not more than 50 μm. The insulating film is thus particularly suitable as an insulating material for a flexible circuit board. The resin composition for an insulating film can be further used for any of various wiring line coating protective agents, heat-resistant adhesives, and electric wire/cable insulating coatings.

Note that the present invention can provide a similar insulating material with use of a resin film that is obtained by applying the resin composition for an insulating film or the resin composition solution for an insulating film to a surface of a base material and drying the surface.

EXAMPLES

The following more specifically describes Examples of the present invention. However, the present invention is not limited to Examples as below.

Synthesis Example 1

<(A) Binder Polymer 1>
Into a reaction vessel equipped with a stirrer, a thermometer, a dropping funnel, a condenser tube, and a nitrogen-inlet tube, 25.00 g of methyl triglyme (1,2-bis(2-methoxyethoxy) ethane) was poured as a solvent for polymerization. Then, 5.16 g (0.024 mol) of norbornene diisocyanate was added thereto, and a mixture was heated to 80° C., while being stirred under nitrogen stream, so that the norbornene diisocyanate was dissolved in the solvent. To a resultant solution, a solution (a) in which 50.0 g (0.025 mol) of polycarbonate diol (manufactured by Asahi Kasei Chemicals Corporation, product name: PCDL T5652, a weight-average molecular weight of 2000) was dissolved into 25.00 g of methyl triglyme, was added dropwise over 1 hour with the dropping funnel. After completion of the dropwise addition, a mixture solution thus obtained was stirred under heating at 80° C. for 5 hours for reaction. As a result of the reaction, a resin solution containing a urethane bond in its molecule was obtained. The resin solution thus obtained had a solid content concentration of 53% and a weight-average molecular weight of 5,600. Measurements of the solid content concentration and the weight-average molecular weight were carried out by the methods as below.

<Solid Content Concentration>

Measurement of the solid content concentration was carried out in accordance with JIS K 5601-1-2. As a drying condition, a condition of 170° C. for 1 hour was selected.

<Weight-Average Molecular Weight>

The measurement was carried out under the following conditions.

Apparatus used: equivalent of HLC-8220GPC manufactured by TOSOH Corporation

Column: TSK gel Super AWM-H manufactured by TOSOH Corporation (6.0 mm I.D.×15 cm) (2 columns)

Guard column: TSK guard column Super AW-H manufactured by TOSOH Corporation

Carrier: 30 mM LiBr+20 mM $H_3PO_4$ in DMF

Flow speed: 0.6 mL/min

Column temperature: 40° C.

Detection conditions: RI: polarity (+), response (0.5 sec)

Sample concentration: approximately 5 mg/mL

Reference standard: PEG (polyethylene glycol).

Synthesis Example 2

<(A) Binder Polymer 2>

Into a reaction vessel equipped with a stirrer, a thermometer, a dropping funnel, a condenser tube, and a nitrogen-inlet tube, 30.00 g of methyl triglyme (1,2-bis(2-methoxyethoxy) ethane) was poured as a solvent for polymerization. Then, 10.31 g (0.050 mol) of norbornene diisocyanate was added thereto, and a mixture was heated to 80° C., while being stirred under nitrogen stream, so that the norbornene diisocyanate was dissolved in the solvent. To a resultant solution, a solution in which (i) 50.0 g (0.025 mol) of polycarbonate diol (manufactured by Asahi Kasei Chemicals Corporation, product name: PCDL T5652, a weight-average molecular weight of 2000) and (ii) 3.70 g (0.025 mol) of 2,2-bis(hydroxymethyl) butanoic acid were dissolved into 30.00 g of methyl triglyme, was added dropwise over 1 hour with the dropping funnel. After completion of the dropwise addition, a mixture solution thus obtained was stirred under heating at 80° C. for 5 hours for reaction. As a result of the reaction, a resin solution containing, in its molecule, a urethane bond and a carboxyl group was obtained. A resin solution thus obtained had a solid content concentration of 52%, a weight-average molecular weight of 5,600, and an acid number of 22 mg KOH/g based on a solid content. Measurements of the solid content concentration and the weight-average molecular weight were carried out by the same methods as in Synthesis Example 1, and measurement of the acid number was carried out by the method as below.

<Acid Number>

Measurement of the acid number was carried out in accordance with JIS K 5601-2-1.

Synthesis Example 3

<(A) Binder Polymer 3>

Into a reaction vessel equipped with a stirrer, a thermometer, a dropping funnel, a condenser tube, and a nitrogen-inlet tube, 100.00 g of methyl triglyme (1,2-bis(2-methoxyethoxy)ethane) was poured as a solvent for polymerization and was then heated to 80° C. while being stirred under nitrogen stream. To the solvent thus heated, a mixed solution prepared by mixing, in advance at room temperature (23° C.), 12.00 g (0.14 mol) of methacrylic acid, 28.00 g (0.16 mol) of benzyl methacrylate, 60.00 g (0.42 mol) of butyl methacrylate, and 0.50 g of azobisisobtyronitrile that serves as a radical polymerization initiator, was added dropwise over 3 hours with the dropping funnel while being heated at 80° C. After completion of the dropwise addition, the reactant solution thus obtained was heated to 90° C. while being stirred, and the reactant solution was reacted by being further stirred under heating for 2 hours while being maintained at 90° C. As a result of the reaction, a resin solution containing a carboxyl group in its molecule was obtained. A resin solution thus obtained had a solid content concentration of 50%, a weight-average molecular weight of 48,000, and an acid number of 78 mg KOH/g based on a solid content. Measurements of the solid content concentration and the weight-average molecular weight were carried out by the same methods as in Synthesis Example 1 above, and measurement of the acid number was carried out by the same method as in Synthesis Example 2.

Synthesis Example 4

<(A) Binder Polymer 4>

Into a reaction vessel equipped with a stirrer, a thermometer, a condenser tube, and a nitrogen-inlet tube, 130.60 g of methyl triglyme (1,2-bis(2-methoxyethoxy)ethane) was poured as a solvent for polymerization. Then, 31.02 g (0.100 mol) of 3,3',4,4'-oxydiphthalic acid dianhydride, 12.92 g (0.030 mol) of bis[4-(3-aminophenoxy)phenyl]sulfone, and 86.66 g (0.070 mol) of poly(tetramethylene/3-methyltetramethylene ether)glycol bis(4-aminobenzoate) were added thereto, and a mixture was stirred for 30 minutes under nitrogen stream, so that a polyamide acid solution was obtained. Then, the polyamide acid solution was heated to 190° C. for 2 hours for reaction. As a result of the reaction, a resin solution containing an imide group in its molecule was obtained. The resin solution thus obtained had a solid content concentration of 49% and a weight-average molecular weight of 28,000. Measurements of the solid content concentration and the weight-average molecular weight were carried out by the same method as in Synthesis Example 1 above.

Synthesis Example 5

<(B) Cross-Linked Polymer Particles, Whose Polymer has Urethane Bond and Carbonate Skeleton in its Molecule>

Into a 1 L separable flask equipped with a stirrer, a thermometer, a dropping funnel, a condenser tube, and a nitrogen-inlet tube, 400.00 g of ion-exchange water was poured and was then heated to 60° C. while being stirred under nitrogen stream. To the ion-exchange water thus heated, a mixed solution prepared by mixing, in advance at room temperature (23° C.), (i) 94.00 g of polycarbonate diol (manufactured by Asahi Kasei Chemicals Corporation, trade name: PCDL T5652, a weight-average molecular weight of 2000), (ii) 56.00 g of hexamethylene diisocyanate-based isocyanurate type polyisocyanate (manufactured by Asahi Kasei Chemicals Corporation; trade name Duranate™ TPA-100; NCO content: 23.1 wt %), (iii) 50.00 g of methyl ethyl ketone as a solvent, and (iv) 0.0015 g of dibutyltin dilaurate as a polymerization catalyst, was added dropwise over 2 hours while being heated at 60° C. After completion of the dropwise addition, the reactant solution thus obtained was reacted while being stirred at 60° C. over 4 hours. Subsequently, the reactant solution was cooled down to room temperature (23° C.), and a solid was separated from the reactant solution. Thereafter, the solid was washed three times with ion-exchange water and then dried at 70° C. for 20 hours to obtain cross-linked polymer particles. The cross-linked polymer particles thus obtained were 6 μm in average particle diameter, and the amount of oil absorption of the cross-linked polymer particles was 90 ml/100 g. Note that measurements of the average particle diameter and the amount of oil absorption were carried out by methods as below.

<Average Particle Diameter Measurement>

Apparatus used: LA-950 V2 manufactured by Horiba, Ltd.
Measurement method: laser differential/scattering method.

<Amount of Oil Absorption>

Measurement of the amount of oil absorption was carried out in accordance with JIS K 5101-13-2.

Examples 1 to 7

<Preparation of Resin Composition for Insulating Film>

To each of the (A) binder polymers 1 to 4 obtained in Synthesis Examples 1 to 4, were added (B) cross-linked polymer particles, whose polymer has a urethane bond and a carbonate skeleton in its molecule, a (C) thermosetting resin, a (F) phosphoric flame retardant, other components, and an organic solvent to prepare resin compositions for insulating films in accordance with Examples 1 to 7. Respective amounts of constituent raw materials in these resin compositions in terms of a resin solid content and the types of the constituent raw materials are shown in Table 1. In Table 1, an amount of 1,2-bis(2-methoxyethoxy)ethane, which is a solvent, indicates a total amount of solvent including a solvent contained in a corresponding one of the resin solutions synthesized above. The resin compositions for insulating films were each prepared by first mixing components by use of a general stirring device having a stirring blade and then passing a resultant mixture through a triple-roll mill twice to obtain a uniform solution. All of the resin compositions for insulating films, in the mixed solution, had a particle diameter of not more than 10 μm as measured by use of a grindmeter. The mixed solution was completely defoamed in a defoaming device, and then subjected to the following evaluations.

TABLE 1

| Component | | | Ex. 1 | Ex. 2 | Ex. 3 | Ex. 4 | Ex. 5 | Ex. 6 | Ex. 7 |
|---|---|---|---|---|---|---|---|---|---|
| | | | | | | | Unit: Part by Weight | | |
| (A) | | Synthesis Example 1 | 60.0 | — | — | — | 60.0 | 60.0 | 60.0 |
| | | Synthesis Example 2 | — | 60.0 | — | — | — | — | — |
| | | Synthesis Example 3 | — | — | 60.0 | — | — | — | — |
| | | Synthesis Example 4 | — | — | — | 60.0 | — | — | — |
| (B) | | Synthesis Example 5 | 30.0 | 30.0 | 30.0 | 30.0 | 18.0 | 60.0 | 30.0 |
| (C) | | TEPIC-SP <1> | 10.0 | 10.0 | 10.0 | 10.0 | 10.0 | 10.0 | 10.0 |
| (F) | | Exolit OP-935 <2> | — | — | — | — | — | — | 20.0 |
| Others | | Fine Powder Melamine <3> | 1.0 | 1.0 | 1.0 | 1.0 | 1.0 | 1.0 | 1.0 |
| | | FLOWLEN AC-2000 <4> | 1.0 | 1.0 | 1.0 | 1.0 | 1.0 | 1.0 | 1.0 |
| Solvent | | 1,2-bis(2-methoxyethoxy)ethane | 100.0 | 100.0 | 100.0 | 100.0 | 100.0 | 100.0 | 100.0 |

Note that <1> to <4> in Table 1 are as follows.
<1> A product name of a multi-functional epoxy resin (triglycidyl isocyanurate) manufactured by Nissan Chemical Industries, Ltd.
<2> A product name of phosphinate manufactured by Clariant (Japan) K. K.
<3> A product name of melamine manufactured by Nissan Chemical Industries, Ltd.
<4> A product name of a butadiene defoaming agent manufactured by Kyoeisha Chemical Co., Ltd.

<Formation of Coating Film on Polyimide Film>

With the use of a Baker's applicator, the resin compositions for insulating films according to Examples 1 to 7 were each flow-cast and applied to a 100 mm×100 mm area of a surface of a 25-μm thick polyimide film (manufactured by Kaneka Corporation, product name: 25NPI) as a base material so that a finally dried film had a thickness of 20 μm. A resultant film was dried at 80° C. for 20 minutes and then cured by heating in an oven at 150° C. for 30 minutes. In this manner, an insulating film (cured film) made from the resin composition for an insulating film was formed on the polyimide film, so that an insulating-film-laminated film (resin film for an insulating film) was prepared.

<Evaluation of Insulating-Film-Laminated Film>

The insulating-film-laminated film thus prepared was evaluated in terms of the following items. Evaluation results are shown in Table 2.

(i) Tack Property

With the use of a Baker's applicator, each of the resin compositions for insulating films according to Examples 1 to 7 were each flow-cast and applied to a 100 mm×100 mm area of a surface of a 25-μm thick polyimide film (manufactured by Kaneka Corporation, product name: 25NPI) as a base material so that a finally dried film had a thickness of 20 μm. A resultant film was dried at 80° C. for 20 minutes to prepare a dried coating film from which the solvent had been dried off. As a result, a film equipped with the coating film was produced. The evaluation of tack property on the coating film was carried out in the following method. The thus prepared film equipped with the dried coating film was cut out into strips each having a size of 50 mm×30 mm. The strips of the coating film were overlaid with each other in such a state that coating film sides of the strips face inside. Subsequently, a load of 300 g was placed on the overlaid strips for 3 seconds. Thereafter, the load was removed, and the overlaid strips were then peeled off each other. The coating film sides of the strips thus peeled off were observed. The result of the observation is indicated as the following ratings, "G (Good)", "U (Unsatisfactory)", and "P (Poor)":

"G (Good)" indicates that the coating films were separated from each other with no tacks left on the coating films;

"U (Unsatisfactory)" indicates that the coating films were slightly stuck to each other with a tack left on the coating films; and "P (Poor)" indicates that the coating films were completely stuck to each other to such a degree that the coating films could not be peeled off each other.

(ii) Folding Endurance

By a method that is the same as the method described in <Formation of Coating Film on Polyimide Film> above, an insulating-film-laminated film was prepared by forming an insulating film made from a resin composition for an insulating film, having a final dried film thickness of 20 μm, on a surface of a 25-μm thick polyimide film (manufactured by Kaneka Corporation, product name: APICAL 25NPI) as a base material. The evaluation of folding endurance on the insulating-film-laminated film was carried out in the following method. The insulating-film-laminated film was cut out into strips each having a size of 50 mm×10 mm. Each of the strips was folded (in the middle) at a point 25 mm from its edge to an angle of 180° in such a state that the insulating film faces outside. Then, a load of 5 kg was placed on a folded part of the strip for 3 seconds. After that, the load was removed, and an apex of the folded part was observed microscopically. After the microscopic observation, the strip was unfolded to approximately 180°, and a load of 5 kg was then placed on the unfolded strip for 3 seconds. After that, the load was removed, and the strip of the cured-film-laminated film was completely unfolded. The above action was repeatedly carried out. The evaluation of folding endurance on the insulating-film-laminated film was carried out in how many times folding had been carried out before cracking occurred on the folded part. Folding endurance is desirably such that no cracking occurs on the insulating film at the completion of fifth or more round of folding.

(iii) Electrical Insulation Reliability

On a flexible copper-clad laminate (the thickness of an electrolytic copper foil is 12 μm, a polyimide film is Apical 25 NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, washed with purified water, and subjected to a surface treatment of the copper foil. After that, by a method that is the same as the method described in <Formation of Coating Film on Polyimide Film> above, an insulating film made from a resin composition for an insulating film, having a final dried film thickness of 20 µm, was formed on the comb-shaped pattern, so as to prepare a test piece (printed wiring board equipped with an insulating film). The test piece was set in an environmental test apparatus at 85° C. and 85% RH, a direct current at 100 V was applied to both ends of the test piece, and measurement of an insulation resistance value of the test piece was carried out 1000 hours after the start of the test. The resistance value of the insulating film is preferably not less than $1 \times 10^8$. Further, 1000 hours after the start of the test, visual observations were made on the occurrence of any change in appearance such as migration or formation of dendrites. The evaluation result is indicated as the following ratings, "G (Good)", "U (Unsatisfactory)", and "P (Poor)":

"G (Good)" indicates that 1000 hours after the start of the test, no occurrence of any change in appearance such as migration or formation of dendrites was observed;

"U (Unsatisfactory)" indicates that 1000 hours after the start of the test, the occurrence of a slight change in appearance such as migration or formation of dendrites was observed; and "P (Poor)" indicates that 1000 hours after the start of the test, the occurrence of a notable change in appearance such as migration or formation of dendrites was observed.

(iv) Solder Heat Resistance

By a method that is the same as the method described in <Formation of Coating Film on Polyimide Film> above, an insulating-film-laminated film was prepared by forming an insulating film made from a resin composition for an insulating film, having a final dried film thickness of 20 µm, on a surface of a 75-µm thick polyimide film (manufactured by Kaneka Corporation, product name: APICAL 75NPI) as a base material. A resultant insulating-film-laminated film was floated on a solder bath that was completely melted at 260° C., in such a state that one surface of the insulating-film-laminated film, on which the insulating film made from the resin composition for an insulating film is applied, was in contact with the solder bath. Ten seconds later, the insulating-film-laminated film was pulled up. This operation was repeated 3 times, and the state of the surface of the film was observed. The observation result is indicated as the following ratings, "G (Good)" and "P (Poor)":

"G (Good)" indicates that there was nothing wrong with the coating film; and

"P (Poor)" indicates that swelling, detachment, and/or the like problem occurred on the coating film.

(v) Warpage

By a method that is the same as the method described in <Formation of Coating Film on Polyimide Film> above, an insulating-film-laminated film was prepared by forming an insulating film made from a resin composition for an insulating film, having a final dried film thickness of 20 µm, on a surface of a 25-µm thick polyimide film (manufactured by Kaneka Corporation, product name: APICAL 25NPI) as a base material. FIG. 1 is a schematic diagram for explaining how to measure the degree of warpage of a film. As shown in FIG. 1, the insulating-film-laminated film 1 (polyimide film on which the insulating film made from the resin composition for an insulating film was laminated) thus obtained was cut out into a film in square shape having an area of 50 mm×50 mm, and the film was placed on a flat and smooth table 3 so that the insulating film side thereof faced upward. Then, a degree 2 of warpage of the film at its end portion was measured. As the degree 2 of warpage of the insulating-film-laminated film 1 is small, stress exerted on a surface on a printed wiring board becomes small. This decreases in warpage of the printed wiring board accordingly. It is preferable that the degree 2 of warpage be not more than 5 mm. Note that in a case the insulating-film-laminated film 1 was rated as "P (poor)" when it curled into a tubular form.

TABLE 2

| Evaluation Item | Ex. 1 | Ex. 2 | Ex. 3 | Ex. 4 | Ex. 5 | Ex. 6 | Ex. 7 | Com. Ex. 1 | Com. Ex. 2 |
|---|---|---|---|---|---|---|---|---|---|
| Tack Property | G | G | G | G | G | G | G | G | P |
| Folding Endurance (time) | 20 | 15 | 15 | 10 | 15 | 20 | 10 | 1 | 3 |
| Electrical Insulation Reliability | | | | | | | | | |
| Insulation Resistance Value (Ω) | $1 \times 10^9$ | $2 \times 10^9$ | $1 \times 10^8$ | $1 \times 10^{10}$ | $3 \times 10^9$ | $1 \times 10^9$ | $1 \times 10^9$ | $1 \times 10^6$ | $5 \times 10^9$ |
| Appearance Change | G | G | G | G | G | G | G | P | G |
| Solder Heat Resistance | G | G | G | G | G | G | G | G | G |
| Warpage (mm) | 1.0 | 2.0 | 1.0 | 2.0 | 2.0 | 0.5 | 1.0 | 7.0 | 5.0 |

Comparative Example 1

Physical property evaluations were carried out by a method that is the same as the methods described in Examples 1 to 7 by use of poly(methylmethacrylate) cross-linked polymer particles (manufactured by Ganz Chemical Co., Ltd., trade name GanzPearl GM-0801S, average particle diameter of 8 µm) instead of the cross-linked polymer particles which were prepared in Synthesis Example 5 and used in Example 1 and whose polymer has a urethane bond and a carbonate skeleton in its molecule. Evaluation results are shown in Table 2.

Comparative Example 2

Physical property evaluations were carried out by a method that is the same as the methods described in Examples 1 to 7 by use of the following components: 60 parts by weight of resin having a urethane bond and a carboxyl group in its molecule, as the binder polymer prepared in Synthesis Example 2; 22.5 parts by weight of epoxy resin (manufactured by Japan Epoxy Resins Co., Ltd., product name: jER828); 2.5 parts by weight of melamine (manufactured by Nissan Chemical Industries, Ltd., product name: Fine Powder Melamine); and 12.0 parts by weight of organic fine particles having a core-shell multilayer structure (manufactured by Ganz Chemical Co., Ltd., product name: STAPHYLOID AC-3816, average particle diameter of 0.5 µm). Evaluation results are shown in Table 2.

Examples 8 to 13

<Preparation of Resin Composition for Insulating Film>

To each of the (A) binder polymers 1 to 4 obtained in Synthesis Examples 1 to 4, were added (B) cross-linked polymer particles, whose polymer has a urethane bond and a carbonate skeleton in its molecule, a (C) thermosetting resin, a (D) compound having a radically polymerizable group in its molecule, a (E) photo-polymerization initiator, a (F) phosphoric flame retardant, other components, and an organic solvent to prepare resin compositions for insulating films in accordance with Examples 8 to 13. Respective amounts of constituent raw materials in these resin compositions in terms of a resin solid content and the types of the constituent raw materials are shown in Table 3. In Table 3, an amount of 1,2-bis(2-methoxyethoxy)ethane, which is a solvent, indicates a total amount of solvent including a solvent contained in a corresponding one of the resin solutions synthesized above. The resin compositions for insulating films were each prepared by first mixing components by use of a general stirring device having a stirring blade and then passing a resultant mixture through a triple-roll mill twice to obtain a uniform solution. All of the resin compositions for insulating films, in the mixed solution, had a particle diameter of not more than 10 μm as measured by use of a grindmeter. The mixed solution was completely defoamed in a defoaming device, and then subjected to the following evaluations.

water sufficiently, and then cured by heating in an oven at 150° C. for 30 minutes. In this manner, an insulating film (cured film) made from the resin composition for an insulating film was formed on the polyimide film, so that an insulating-film-laminated film (resin film for an insulating film) was prepared.

<Evaluation of Insulating-Film-Laminated Film>

The insulating-film-laminated film thus prepared was evaluated in regard to the following items. Evaluation results are shown in Table 4.

(vi) Photosensitivity

Photosensitivity of each of the resin compositions for insulating films was evaluated by observing a surface of a corresponding insulating film prepared by a method that is the same as the method described in <Formation of Coating Film on Polyimide Film> above. Note that exposure was carried out by placing a negative photomask having a line width/space width=100 μm/100 μm. The evaluation result is indicated as the following ratings, "G (Good)" and "P (Poor)":

"G (Good)" indicates that a sensitive pattern of line width/space width=100 μm/100 μm was clearly formed on a surface of a polyimide film, and the sensitive pattern has no notable bold line and no residue from development; and "P (Poor)" indicates that a sensitive pattern of line width/space width=100/100 μm was not formed on a surface of a polyimide film.

TABLE 3

Unit: Part by Weight

| Component | | Ex. 8 | Ex. 9 | Ex. 10 | Ex. 11 | Ex. 12 | Ex. 13 |
|---|---|---|---|---|---|---|---|
| (A) | Synthesis Example 1 | 40.0 | — | — | — | — | — |
| | Synthesis Example 2 | — | 40.0 | — | — | 40.0 | 40.0 |
| | Synthesis Example 3 | — | — | 40.0 | — | — | — |
| | Synthesis Example 4 | — | — | — | 40.0 | — | — |
| (B) | Synthesis Example 5 | 30.0 | 30.0 | 30.0 | 30.0 | 12.0 | 40.0 |
| (C) | TEPIC-SP <1> | 10.0 | 10.0 | 10.0 | 10.0 | 10.0 | 10.0 |
| (D) | FANCRYL FA-321M <5> | 15.0 | 15.0 | 15.0 | 15.0 | 15.0 | 15.0 |
| | UXE-3000 <6> | 20.0 | 20.0 | 20.0 | 20.0 | 20.0 | 20.0 |
| (E) | IRUGACURE 369 <7> | 3.0 | 3.0 | 3.0 | 3.0 | 3.0 | 3.0 |
| (F) | Exolit OP-935 <2> | 20.0 | 20.0 | 20.0 | 20.0 | 20.0 | 20.0 |
| Others | Fine Powder Melamine <3> | 1.0 | 1.0 | 1.0 | 1.0 | 1.0 | 1.0 |
| | FLOWLEN AC-2000 <4> | 1.0 | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 | 100.0 |

Note that <1> to <7> in Table 1 are as follows.
<1> A product name of a multi-functional epoxy resin (triglycidyl isocyanurate) manufactured by Nissan Chemical Industries, Ltd.
<2> A product name of phosphinate manufactured by Clariant (Japan) K. K.
<3> A product name of melamine manufactured by Nissan Chemical Industries, Ltd.
<4> A product name of a butadiene defoaming agent manufactured by Kyoeisha Chemical Co., Ltd.
<5> A product name of a compound having a radically polymerizable group in its molecule (EO-modified bisphenol A dimethacrylate) manufactured by Hitachi Chemical Co., Ltd.
<6> A product name of a compound having a radically polymerizable group in its molecule (resin containing a carboxyl group and a photosensitive group) (solid content concentration of 65%, acid number of 98 mgKOH/g based on solid content) manufactured by Nippon Kayaku Co., Ltd
<7> A product name of a photo-polymerization initiator manufactured by BASF Japan Ltd.

<Formation of Coating Film on Polyimide Film>

With the use of a Baker's applicator, the resin compositions for insulating films according to Examples 8 to 13 were each flow-cast and applied to a 100 mm×100 mm area of a surface of a 25-μm thick polyimide film (manufactured by Kaneka Corporation, product name: 25NPI) as a base material so that a finally dried film had a thickness of 20 μm. A resultant film was dried at 80° C. for 20 minutes and then exposed to ultraviolet rays having an integrated exposure amount of 300 mJ/cm$^2$. Subsequently, the film was developed by spraying a 1.0 weight % sodium carbonate aqueous solution heated to 30° C., at a spraying pressure of 1.0 kgf/mm$^2$ for 90 seconds. After the spray development, the film was rinsed with purified (vii) Tack Property With the use of a Baker's applicator, the resin compositions for insulating films according to Examples 8 to 13 were each flow-cast and applied to a 100 mm×100 mm area of a surface of a 25-μm thick polyimide film (manufactured by Kaneka Corporation, product name: 25NPI) as a base material so that a finally dried film had a thickness of 20 μm. A resultant film was dried at 80° C. for 20 minutes to prepare a dried coating film from which the solvent had been dried off. As a result, a film equipped with the coating film was produced. The evaluation of tack property on the coating film was carried out in the following method. The thus prepared film equipped with the dried coating film was cut out into strips each having a size of 50 mm×30 mm. The strips of the coating film were overlaid with each other in such a state that coating film sides of the strips face inside. Subsequently, a load of 300 g was placed on the overlaid strips for 3 seconds. Thereafter, the load was removed, and the overlaid strips were then peeled off each other. The coating film sides of the strips thus peeled off were observed. The result of the observation is indicated as the following ratings, "G (Good)", "U (Unsatisfactory)", and "P (Poor)":

"G (Good)" indicates that the coating films were separated from each other with no tacks left on the coating films;

"U (Unsatisfactory)" indicates that the coating films were slightly stuck to each other with a tack left on the coating films; and "P (Poor)" indicates that the coating films were completely stuck to each other to such a degree that the coating films could not be peeled off each other.

(viii) Folding Endurance

By a method that is the same as the method described in <Formation of Cured Film on Polyimide Film> above, an insulating-film-laminated film was prepared by forming an insulating film made from a resin composition for an insulating film, having a final dried film thickness of 20 μm, on a surface of a 25-μm thick polyimide film (manufactured by Kaneka Corporation, product name: APICAL 25NPI) as a base material. The evaluation of folding endurance on the insulating-film-laminated film was carried out in the following method. The insulating-film-laminated film was cut out into strips each having a size of 50 mm×10 mm. Each of the strips was folded (in the middle) at a point 25 mm from its edge to an angle of 180° in such a state that the insulating film faces outside. Then, a load of 5 kg was placed on a folded part of the strip for 3 seconds. After that, the load was removed, and an apex of the folded part was observed microscopically. After the microscopic observation, the strip was unfolded to approximately 180°, and a load of 5 kg was then placed on the unfolded strip for 3 seconds. After that, the load was removed, and the strip of the insulating-film-laminated film was completely unfolded. The above action was repeatedly carried out. The evaluation of folding endurance on the insulating-film-laminated film was carried out in how many times folding had been carried out before cracking occurred on the folded part. Folding endurance is desirably such that no cracking occurs on the insulating film at the completion of fifth or more round of folding.

(ix) Electrical Insulation Reliability

On a flexible copper-clad laminate (the thickness of an electrolytic copper foil is 12 μm, a polyimide film is Apical 25 NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, washed with purified water, and subjected to a surface treatment of the copper foil. After that, by a method that is the same as the method described in <Formation of Coating Film on Polyimide Film>, an insulating film made from a resin composition for an insulating film, having a final dried film thickness of 20 μm, was formed on the comb-shaped pattern, so as to prepare a test piece (printed wiring board equipped with an insulating film). The test piece was set in an environmental test apparatus at 85° C. and 85% RH, a direct current at 100 V was applied to both ends of the test piece, and measurement of an insulation resistance value of the test piece was carried out 1000 hours after the start of the test. The resistance value is preferably not less than $1\times10^8$. Further, 1000 hours after the start of the test, visual observations were made on the occurrence of any change in appearance such as migration or formation of dendrites. The evaluation result is indicated as the following ratings, "G (Good)", "U (Unsatisfactory)", and "P (Poor)":

"G (Good)" indicates that 1000 hours after the start of the test, no occurrence of any change in appearance such as migration or formation of dendrites was observed;

"U (Unsatisfactory)" indicates that 1000 hours after the start of the test, the occurrence of a slight change in appearance such as migration or formation of dendrites was observed; and "P (Poor)" indicates that 1000 hours after the start of the test, the occurrence of a notable change in appearance such as migration or formation of dendrites was observed.

(x) Solder Heat Resistance

By a method that is the same as the method described in <Formation of Coating Film on Polyimide Film> above, an insulating-film-laminated film was prepared by forming an insulating film made from a resin composition for an insulating film, having a final dried film thickness of 20 μm, on a surface of a 75-μm thick polyimide film (manufactured by Kaneka Corporation, product name: APICAL 75NPI) as a base material. A resultant insulating-film-laminated film was floated on a solder bath that was completely melted at 260° C., in such a state that one surface of the insulating-film-laminated film, on which the insulating film made from the resin composition for an insulating film is applied, was in contact with the solder bath. Ten seconds later, the insulating-film-laminated film was pulled up. This operation was repeated 3 times, and the state of the surface of the film was observed. The observation result is indicated as the following ratings, "G (Good)" and "P (Poor)":

"G (Good)" indicates that there was nothing wrong with the coating film; and

"P (Poor)" indicates that swelling, detachment, and/or the like problem occurred on the coating film.

(xi) Warpage

By a method that is the same as the method described in <Formation of Coating Film on Polyimide Film> above, an insulating-film-laminated film was prepared by forming an insulating film made from a resin composition for an insulating film, having a final dried film thickness of 20 μm, on a surface of a 25-μm thick polyimide film (manufactured by Kaneka Corporation, product name: APICAL 25NPI) as a base material. FIG. 1 is a schematic diagram for explaining how to measure the degree of warpage of a film. As shown in FIG. 1, the insulating-film-laminated film 1 (polyimide film on which the insulating film made from the resin composition for an insulating film was laminated) thus obtained was cut out into a film in square shape having an area of 50 mm×50 mm, and the film was placed on a flat and smooth table 3 so that the insulating film side thereof faced upward. Then, a degree 2 of warpage of the film at its end portion was measured. As the degree 2 of warpage of the insulating-film-laminated film 1 is small, stress exerted on a surface on a printed wiring board becomes small. This decreases in warpage of the printed wiring board accordingly. It is preferable that the degree 2 of warpage be not more than 5 mm. Note that in a case the insulating-film-laminated film 1 was rated as "P (poor)" when it curled into a tubular form.

(xii) Flame Retardancy

In accordance with UL94VTM standard for test for flammability of plastic materials, a flammability test was carried out as follows. By a method that is the same as the method described in <Formation of Coating Film on Polyimide Film> above, an insulating-film-laminated film was prepared by forming an insulating film made from the resin composition for an insulating film, having a final dried film thickness of 20

μm, on both surfaces of a 25-μm thick polyimide film (manufacture by Kaneka Corporation, product name: APICAL 25NPI) as a base material. The insulating-film-laminated film thus prepared was cut into 20 specimens each having a dimension of 50 mm in width, by 200 mm in length, and by 75 μm in thickness (including the thickness of the polyimide film). The specimens were each marked with a line across the specimen width at a 125 mm position from one end of the specimen, and each of the specimens was then rolled into a tubular form of approximately 13 mm in diameter by 200 mm in length with the marked line faced outward. Thereafter, the specimen was secured in such a manner that a PI (polyimide) tape is placed, without clearance, over (a) an overlapping portion (75 (200-125) mm-long portion) of the specimen above the marked line and (b) an upper end portion (film end portion) of the specimen above the overlapping portion. In this manner, 20 samples (tubes) for use in the flammability test were prepared. Out of the 20 samples, 10 samples were processed (1) at 23° C. and a relative humidity of 50% for 48 hours, whereas the remaining 10 samples were processed (2) at 70° C. for 168 hours and then cooled for more than 4 hours in a desiccator containing anhydrous calcium chloride. These samples were each clamped at the upper end portion thereof (i.e., the end portion where the PI tape is placed) so as to be fixed upright (hung from above), and flame of a burner was applied to a free lower end portion (i.e., an end portion where the PI tape is not placed) of the sample for 3 seconds so that the free lower end portion was ignited. After a lapse of 3 seconds, the flame of the burner was removed from the sample, and the length of time (in seconds) for which the sample continued to flame and/or burn after the burner had been removed from the sample was measured. The measurement result was rated as the following ratings, "G (Good)" and "P (Poor)":

"G (Good)" indicates that all the 10 samples each out of two sets of the samples processed respectively under the conditions (1) and (2), ceased to flame and/or burn and automatically became extinct within 10 seconds at maximum after the removal of the burner from the sample, and ceased to burn before flaming reaches the marked line.

"P (Poor)" indicates that even one of all the 10 samples each out of two sets of the samples processed respectively under the conditions (1) and (2), did not extinct within 10 seconds after the removal of the burner or burned with flame going up to or beyond the marked line.

Comparative Example 3

Physical property evaluations were carried out by a method that is the same as the method described in Example 8 by use of poly(methylmethacrylate) cross-linked polymer particles (manufactured by Ganz Chemical Co., Ltd., trade name GanzPearl GM-0801S, average particle diameter of 8 μm) instead of the (B) cross-linked polymer particles which were prepared in Synthesis Example 5 and used in Example 8 and whose polymer has a urethane bond and a radically polymerizable group in its molecule. Evaluation results are shown in Table 4.

INDUSTRIAL APPLICABILITY

A resin composition for an insulating film, in accordance with the present invention, is suitably usable as a surface protecting material or the like for various circuit boards.

REFERENCE SIGNS LIST

1 Insulating-film-laminated film (polyimide film laminated with an insulating film made from a resin composition for an insulating film)
2 Degree of warpage
3 Flat and smooth table

The invention claimed is:
1. A resin composition for an insulating film, the resin composition comprising at least:
    a (A) binder polymer; and
    (B) cross-linked polymer particles, whose polymer has a urethane bond and a carbonate skeleton in its molecule.
2. The resin composition as set forth in claim 1, further comprising:
    a (C) thermosetting resin.
3. The resin composition as set forth in claim 1, further comprising:
    a (D) compound having a radically polymerizable group in its molecule; and
    a (E) photo-polymerization initiator.
4. The resin composition as set forth in claim 1, wherein the (A) binder polymer has at least one selected from the group consisting of the following (a1) through (a3) : a (a1) urethane bond; a (a2) carboxyl group; and an (a3) imide group.

TABLE 4

| Evaluation Item | Ex. 8 | Ex. 9 | Ex. 10 | Ex. 11 | Ex. 12 | Ex. 13 | Com. Ex. 3 |
|---|---|---|---|---|---|---|---|
| Photosensitivity | G | G | G | G | G | G | G |
| Tack Property | G | G | G | G | G | G | G |
| Folding Endurance (time) | 10 | 10 | 7 | 5 | 7 | 10 | 1 |
| Electrical Insulation Reliability | | | | | | | |
| Insulation Resistance Value ($\Omega$) | $2 \times 10^9$ | $4 \times 10^9$ | $5 \times 10^8$ | $1 \times 10^{10}$ | $5 \times 10^9$ | $1 \times 10^9$ | $1 \times 10^7$ |
| Appearance Change | G | G | G | G | G | G | P |
| Solder Heat Resistance | G | G | G | G | G | G | G |
| Warpage (mm) | 1.0 | 1.5 | 1.0 | 2.0 | 1.5 | 1.0 | 10.0 |
| Flame Retardancy | G | G | G | G | G | G | G |

5. The resin composition as set forth in claim 1, wherein the (B) cross-linked polymer particles, whose polymer has a urethane bond and a carbonate skeleton in its molecule, are not less than 1 µm and not more than 20 µm in average particle diameter.

6. The resin composition as set forth in claim 1, wherein an amount of oil absorption of the (B) cross-linked polymer particles, whose polymer has a urethane bond and a carbonate skeleton in its molecule, is not less than 50 ml/100 g.

7. The resin composition as set forth in claim 1, wherein the (B) cross-linked polymer particles, whose polymer has a urethane bond and a carbonate skeleton in its molecule, is mixed in an amount of not less than 30 parts by weight and not more than 100 parts by weight, with respect to 100 parts by weight of the (A) binder polymer.

8. The resin composition as set forth in claim 1, further comprising:
a (F) phosphoric flame retardant.

9. The resin composition as set forth in claim 8, wherein the (F) phosphoric flame retardant is phosphinate.

10. The resin composition as set forth in claim 8, wherein the (F) phosphoric flame retardant is mixed in an amount of not less than 5 parts by weight and not more than 100 parts by weight, with respect to 100 parts by weight of the (A) binder polymer.

11. A resin film for an insulating film, the resin film being obtained by applying, to a surface of a base material, the resin composition for an insulating film which resin composition is recited in claim 1 and then drying the resin composition.

12. An insulating film obtained by curing the resin film for an insulating film which resin film is recited in claim 11.

13. A printed wiring board provided with an insulating film, wherein
the printed wiring board is covered with the insulating film recited in claim 12.

14. A resin film for an insulating film, the resin film being obtained from the resin composition for an insulating film which resin composition is recited in claim 1.

15. An insulating film obtained from the resin composition for an insulating film which resin composition is recited in claim 1.

16. A printed wiring board provided with an insulating film, wherein
the printed wiring board is covered with the insulating film as recited in claim 15.

* * * * *